United States Patent
Ito et al.

(10) Patent No.: US 7,713,884 B2
(45) Date of Patent: May 11, 2010

(54) METHOD OF MANUFACTURING SEMICONDUCTOR DEVICE THAT INCLUDES FORMING METAL OXIDE FILM ON SEMICONDUCTOR WAFER

(75) Inventors: Hiromi Ito, Tokyo (JP); Yuuichi Kamimuta, Yokohama (JP); Yukimune Watanabe, Chino (JP); Shinji Migita, Tsukuba (JP)

(73) Assignees: Renesas Technology Corp., Tokyo (JP); Seiko Epson Corporation, Tokyo (JP)

( * ) Notice: Subject to any disclaimer, the term of this patent is extended or adjusted under 35 U.S.C. 154(b) by 134 days.

(21) Appl. No.: 12/142,634

(22) Filed: Jun. 19, 2008

(65) Prior Publication Data

US 2008/0318439 A1    Dec. 25, 2008

(30) Foreign Application Priority Data

Jun. 22, 2007    (JP) .............................. 2007-164786

(51) Int. Cl.
*H01L 21/473* (2006.01)
(52) U.S. Cl. ............... 438/778; 438/785; 257/E21.272; 257/E21.494
(58) Field of Classification Search ........... 257/E21.494
See application file for complete search history.

(56) References Cited

U.S. PATENT DOCUMENTS 7,312,494 B2 * 12/2007 Ahn et al. .................. 257/310

| 2005/0045092 | A1 * | 3/2005 | Wu et al. ...................... 117/92 |
| 2006/0147627 | A1 | 7/2006 | Tominaga et al. |
| 2008/0050884 | A1 * | 2/2008 | Koyanagi et al. ........... 438/387 |
| 2008/0274615 | A1 * | 11/2008 | Vaartstra ..................... 438/685 |

FOREIGN PATENT DOCUMENTS

| JP | 2005-235967 A | 9/2005 |
| JP | 2006-169556 A | 6/2006 |
| WO | WO 2006/088463 A1 * | 8/2006 |

* cited by examiner

*Primary Examiner*—Stephen W Smoot
(74) *Attorney, Agent, or Firm*—Miles & Stockbridge P.C.

(57) ABSTRACT

A semiconductor wafer is placed in a chamber of a film-deposition apparatus, and gas in the chamber is exhausted from a gas exhaust outlet. Then, with interrupting the exhaust, an inert gas is introduced into the chamber so that the chamber has a pressure of 133 Pa or higher and lower than 101325 Pa, and then a mixed gas of an inert gas and a source gas for depositing a metal oxide film is introduced into the chamber. Then, after exhausting the gas in the chamber, an oxidation gas is introduced into the chamber to react with the molecules of the source gas absorbed on the semiconductor wafer to form a metal oxide film on the semiconductor wafer. By repeating these steps, a metal oxide film having a desired film thickness is deposited on the semiconductor wafer with a film-thickness distribution by an ALD method.

20 Claims, 19 Drawing Sheets

Ln: RARE-EARTH ELEMENT
R : ALKYL GROUP

METHOD OF MANUFACTURING SEMICONDUCTOR DEVICE THAT INCLUDES FORMING METAL OXIDE FILM ON SEMICONDUCTOR WAFER

CROSS-REFERENCE TO RELATED APPLICATION

The present application claims priority from Japanese Patent Application No. JP 2007-164786 filed on Jun. 22, 2007, the content of which is hereby incorporated by reference into this application.

TECHNICAL FIELD OF THE INVENTION

The present invention relates to a method of manufacturing a semiconductor device. More particularly, the present invention relates to a technology effectively applied to a method of manufacturing a semiconductor device comprising a step of forming a metal oxide film on a semiconductor wafer.

BACKGROUND OF THE INVENTION

In recent years, along with the advance of miniaturization of MIS transistors configuring semiconductor integrated circuits, thinning of a gate insulating film of MIS transistor made of silicon oxide has been advanced rapidly. Meanwhile, when the film thickness of the gate insulating film gets thinner, due to a quantum effect called direct tunneling, a gate leakage phenomenon gets significant, in which electrons in a silicon substrate are escaped through the gate insulating film to a gate electrode.

To get around this problem, a study to replace the gate insulating film material by an insulating material (high-k material) having a relative permittivity (dielectric constant) higher than that of silicon oxide ($SiO_2$) has been considered. This way is advantageous because the actual physical film thickness can be increased by multiplying [permittivity of the high-k film divided by permittivity of the silicon oxide film] by itself when the gate insulating film is formed of a high-k material, even with a same equivalent silicon oxide film thickness, resulting in a reduction of the gate leakage current. As a high-k material, hafnium oxide and aluminum oxide have been considered, for example.

In addition, one example of a method of depositing a film having a thin film thickness as a gate insulating film with excellent controllability is ALD (Atomic Layer Deposition) method. Technologies regarding this ALD method are disclosed in, for example, Japanese Patent Application Laid-Open Publication No. 2006-169556 (Patent Document 1) and Japanese Patent Application Laid-Open Publication No. 2005-235967 (Patent Document 2).

SUMMARY OF THE INVENTION

According to a study by the inventors of the present invention, the following has been revealed.

When the ALD method is used to deposit a hafnium oxide film on a semiconductor wafer, tetrakisdimethylamino-hafnium (its chemical formula is $Hf[N(CH_3)_2]_4$) can be used as a hafnium source gas, for example. When an aluminum oxide film is deposited, trimethylaluminum (its chemical formula is $Al(CH_3)_3$) can be used as an aluminum source gas.

On the other hand, rare-earth oxides are also high-k materials, and are effective to the gate insulating film and so forth. By using a rare-earth oxide film as the gate insulating film, it is also possible to control the threshold value of a MISFET.

Accordingly, the inventors have studied on deposition of rare-earth oxide films on a semiconductor wafer by using the ALD method. As a result, it was found that a rare-earth oxide film has an uneven film-thickness distribution on the main surface of the semiconductor wafer, more unevenly than that of a hafnium oxide film and an aluminum oxide film. The cause for this fact was studied and found that, when a source gas is introduced into a chamber having a semiconductor wafer disposed therein, the temperature of the gas is decreased due to adiabatic expansion where the gas is prone to condense, thereby causing the source gas to partially condense on the surface of the semiconductor wafer and increasing the film thickness in an area where condensation has occurred, which causes the film-thickness to become uneven. Furthermore, the following was also found that, when the source gas is introduced into the chamber while the gas in the chamber is always exhausted, the source gas flows linearly in one direction from a gas inlet to a gas exhaust outlet in the chamber. Since a turbulence-like gas flow is difficult to occur, the molecules of the source gas are absorbed on the surface of the semiconductor wafer in a distribution along the flow of the gas, thereby causing the film-thickness distribution on the semiconductor wafer to become uneven. Such a phenomenon more significantly appears when a rare-earth oxide film is deposited compared with the case where a hafnium oxide film or an aluminum oxide film is deposited. The cause may be as follows. While the source gases for a hafnium oxide film and an aluminum oxide film have a relatively high vapor pressure, the problem of condensation does not occur much. However, since the source gas capable of being used for a rare-earth oxide film has a low pressure, when the source gas is introduced into the chamber, the source gas tends to condense in a decrease in temperature due to adiabatic expansion, thereby causing the film-thickness distribution to tend to become uneven. Still further, since the source gases for a hafnium oxide film and an aluminum oxide film each have a high absorption rate onto the semiconductor wafer, the distribution of the molecules of the source gas absorbed on the semiconductor wafer is not much influenced by the route of flow of the source gas in the chamber. However, since the source gas capable of being used for a rare-earth oxide film has a low absorption rate onto the semiconductor wafer, the distribution of the molecules of the source gas absorbed on the semiconductor wafer tends to be influenced by the route of flow of the source gas in the chamber.

When the film-thickness distribution of the metal oxide film on the main surface of the semiconductor wafer is uneven, the metal oxide film has different film thicknesses depending on the position on the main surface of the semiconductor wafer. If such a metal oxide film is used to form a semiconductor element and the like, its characteristics disadvantageously become uneven. Therefore, there is a need to deposit a metal-oxide film with an even film-thickness distribution on the main surface of the semiconductor wafer.

An object of the resent invention is to provide a technique capable of forming a metal oxide film having an even film-thickness distribution on a semiconductor wafer.

The above and other objects and novel characteristics of the present invention will be apparent from the description of this specification and the accompanying drawings.

The typical ones of the inventions disclosed in this application will be briefly described as follows.

In the present invention, an inert gas is introduced into a chamber having a semiconductor wafer disposed therein so that the chamber has a first pressure of 133 Pa (1 Torr) or higher, and lower than 101325 Pa (1 atmospheric pressure), and a source gas is introduced into the chamber at the first pressure without exhaust. Then, after the source gas in the chamber is exhausted to outside of the chamber, an oxidation gas is introduced into the chamber for reaction with molecules of the source gas absorbed on the semiconductor wafer to form a metal oxide film on the semiconductor wafer.

The effects obtained by typical aspects of the present invention will be briefly described below.

A metal oxide film having an even film-thickness distribution can be formed on a semiconductor wafer.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above. In addition, the description of the same or similar portions is not repeated in principle unless particularly required in the following embodiments.

Hereinafter, embodiments of the present invention will be described in detail with reference to the accompanying drawings. Note that, components having the same function are denoted by the same reference symbols throughout the drawings for describing the embodiment, and the repetitive description thereof will be omitted.

Also, in some drawings used in the embodiments, hatching is used even in a plan view so as to make the drawings easy to see.

A process of manufacturing a semiconductor device according to a present embodiment will be described with reference to the drawings.

The process of manufacturing a semiconductor device according to the present embodiment includes a step of forming (depositing) a metal oxide film 2 on a main surface of a semiconductor wafer 1W. This step of forming the metal oxide film 2 on the main surface of the semiconductor wafer 1W will be described.

Figure 1:
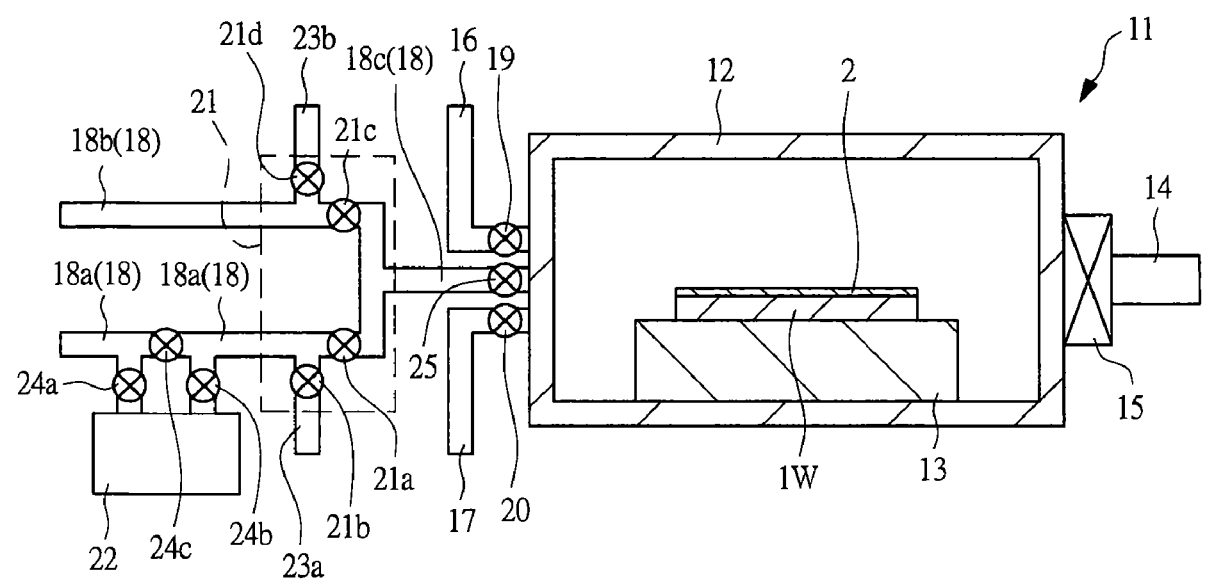
FIG. 1 is an illustrative diagram showing a structure of a semiconductor manufacturing apparatus for use in a process of forming a metal oxide film on a semiconductor wafer according to one embodiment of the present invention.

FIG. 1 is an illustrative diagram (schematic cross-sectional view) showing a conceptual structure of a semiconductor manufacturing apparatus (film-deposition apparatus 11) for use in the step of forming the metal oxide film 2 on (the main surface of) the semiconductor wafer 1W according to an embodiment of the present invention.

The semiconductor manufacturing apparatus shown in FIG. 1 is a film-deposition apparatus 11 that can deposit a metal oxide film on a semiconductor wafer, and is a so-called ALD (Atomic Layer Deposition or Atomic layer Control Deposition) apparatus. The film-deposition apparatus 11 includes a chamber (reaction chamber, film-deposition chamber, reaction room, processing room) 12 capable of being vacuum-hermetic for performing a film-deposition process on the semiconductor wafer 1W, and a wafer stage (mounting table, wafer holder) 13 disposed in the chamber 12 to have mounted (disposed, held) thereon the semiconductor wafer 1W. The wafer stage 13 is configured to be able to heat the mounted semiconductor wafer 1W, and has a heater embedded therein, for example.

The chamber 12 is a vacuum-hermetic deposition chamber, and is configured to be connected to a gas exhaust means (for example, a vacuum pump) not shown through a gas exhaust outlet 14 for vacuum exhaust from the gas exhaust outlet 14 of the chamber 12 at a desired exhaust rate. The gas exhaust outlet 14 has a gate valve 15 mounted thereon. By opening and closing the gate valve 15, the state can be switched between the state of exhausting air from the chamber 12 and the state of not exhausting. Also, by adjusting an open/close state of the gate valve 15, the exhaust rate of the chamber 12 can be adjusted.

Also, gas paths 16, 17, 18 are connected to the chamber 12, and the chamber 12 is configured to be able to introduce a desired gas from the gas paths 16, 17, 18 into the chamber 12 at a desired flow rate. The gas paths 16, 17, 18 are formed of pipes for gas, for example, through which a gas can flow. Of these, the gas path 16 is configured to be able to introduce an inert gas into the chamber 12. The gas path 17 is configured to be able to introduce an oxidation gas into the chamber 12.

The gas path 16 is provided with a valve (switching valve, switching device, switching unit) 19 near a connecting portion with the chamber 12. This valve 19 is configured to enable switching between the state of interrupting an inflow of the gas (here, inert gas) from the gas path 16 into the chamber 12 and the state of permitting the inflow of the gas (here, inert gas) from the gas path 16 into the chamber 12. And, the gas path 17 is provided with a valve (switching valve, switching device, switching unit) 20 near a connecting portion with the chamber 12. This valve 20 is configured to enable switching between the state of interrupting an inflow of the gas (here, oxidation gas) from the gas path 17 into the chamber 12 and the state of permitting the inflow of the gas (here, inert gas) from the gas path 17 into the chamber 12.

The gas path 18 includes a gas path (first gas path) 18c connected to the chamber 12, a gas path (second gas path) 18a for feeding a mixed gas (first gas corresponding a gas 33, described further below) of a source gas and an inert gas (inert gas 32, described further below) to the gas path 18c, and a gas path (third path) 18b for feeding an inert gas (second gas corresponding to an inert gas 34, which will be described further below) not including a source gas to the gas path 18c. The gas path 18c is provided between the gas paths 18a, 18b, and the chamber 12.

The gas paths 18a, 18b, 18c have connecting portions provided with a switching valve (switching device, switching unit) 21. This switching valve 21 is configured to be able to switch among the state of interrupting a gas inflow from the gas paths 18a, 18b to the gas path 18c, the state of interrupting a gas inflow from the gas path 18b to the gas path 18c and permitting a gas inflow from the gas path 18a to the gas path 18c, and the state of interrupting a gas inflow from the gas path 18a to the gas path 18c and permitting a gas inflow from the gas path 18b to the gas path 18c.

Here, for simplification of understanding, the switching state of the switching valve 21 is schematically shown with the open/close states of four valves 21a, 21b, 21c, 21d in FIG. 2 and FIGS. 4 to 10, which will be described further below. The state in which the valve 21a is closed and the valve 21b is open corresponds to the state in which a gas inflow from the gas path 18a to the gas path 18c is interrupted and the gas from the gas path 18a is exhausted from an exhaust path 23a. And, the state in which the valve 21a is open and the valve 21b is closed corresponds to the state in which the gas inflow from the gas path 18a to the gas path 18c is permitted and a gas exhaust from the gas path 18a to the exhaust path 23a is interrupted. And, the state in which the valve 21c is closed and the valve 21d is open corresponds to the state in which a gas inflow from the gas path 18b to the gas path 18c is interrupted and the gas from the gas path 18b is exhausted from an exhaust path 23b. Furthermore, the state in which the valve 21c is open and the valve 21d is closed corresponds to the state in which the gas inflow from the gas path 18b to the gas path 18c is permitted and a gas exhaust from the gas path 18b to the exhaust path 23b is interrupted.

Still further, the gas path 18a is configured so that valves 24a, 24b, and 24c are switched so that an inert gas for carrier fed to the gas path 18a passes through a deposition source chamber 22. Therefore, in the deposition source chamber 22, the inert gas for carrier fed to the gas path 18a is mixed with a source gas generated by evaporation (vaporization) of a deposition source liquid to form a mixed gas of the inert gas and the source gas, which goes out of the deposition source chamber 22 and then further goes to the position of the switching valve 21 through the gas path 18a. For the mixed gas of the inert gas and the source gas that goes to the position of the switching valve 21, switching of the switching valves 21 selects a way to go to the gas path 18c or to be exhausted from the exhaust path 23 not going to the gas path 18c.

And, the gas path 18c is provided with a valve (switching valve, switching device, switching unit) 25 near a connecting portion with the chamber 12. The valve 25 is configured to enable a switching between the state of interrupting a gas inflow from the gas path 18c into the chamber 12 and the state of permitting the gas inflow from the gas path 18c into the chamber 12.

Next, a process of forming (depositing) the metal oxide film 2 on (the main surface of) the semiconductor wafer 1W according to one embodiment of the present invention will be described in the step order.

Figure 2:
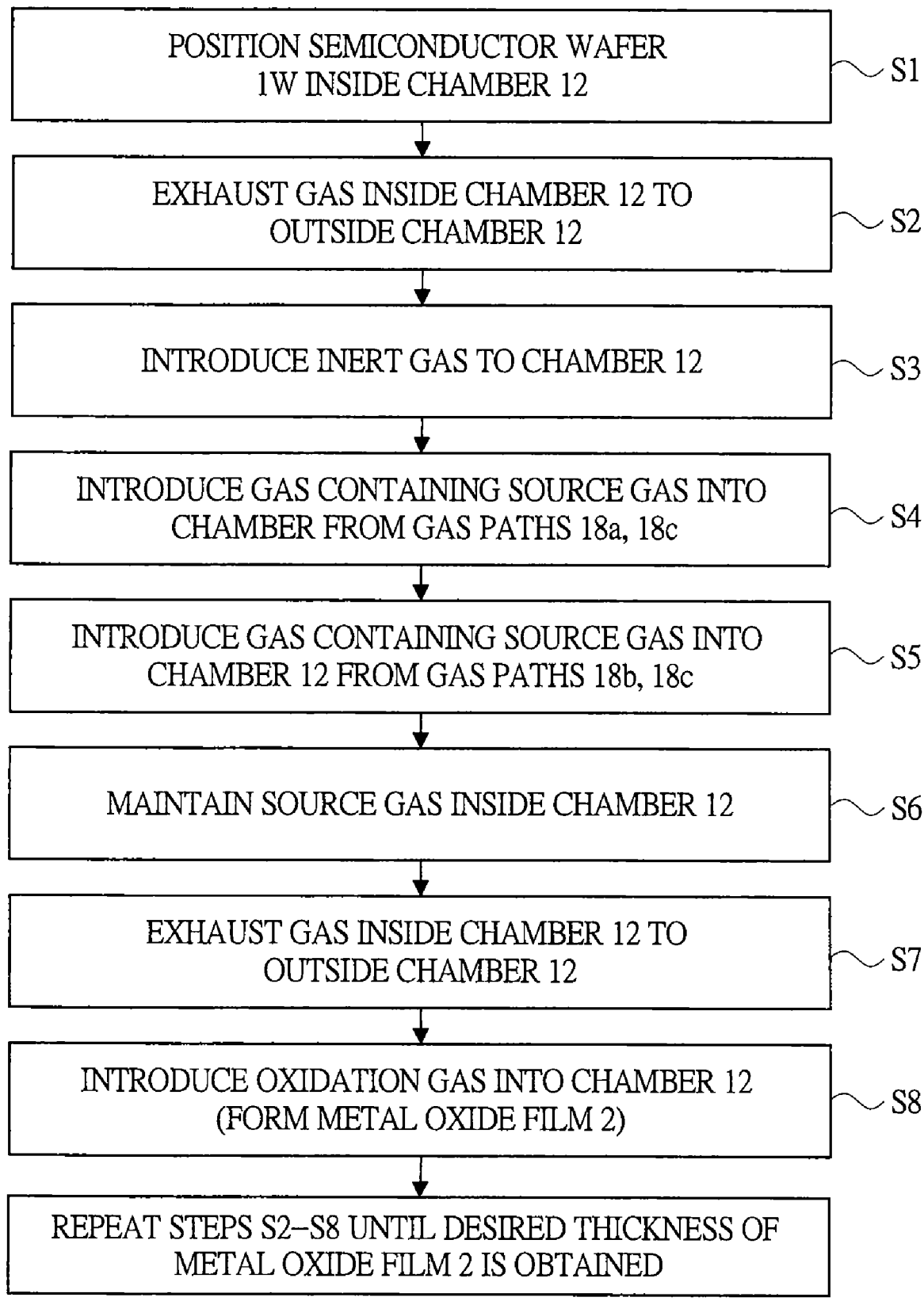
FIG. 2 is a manufacturing process flow chart showing the process of forming a metal oxide film on a semiconductor wafer according to the embodiment of the present invention.
Figure 3:
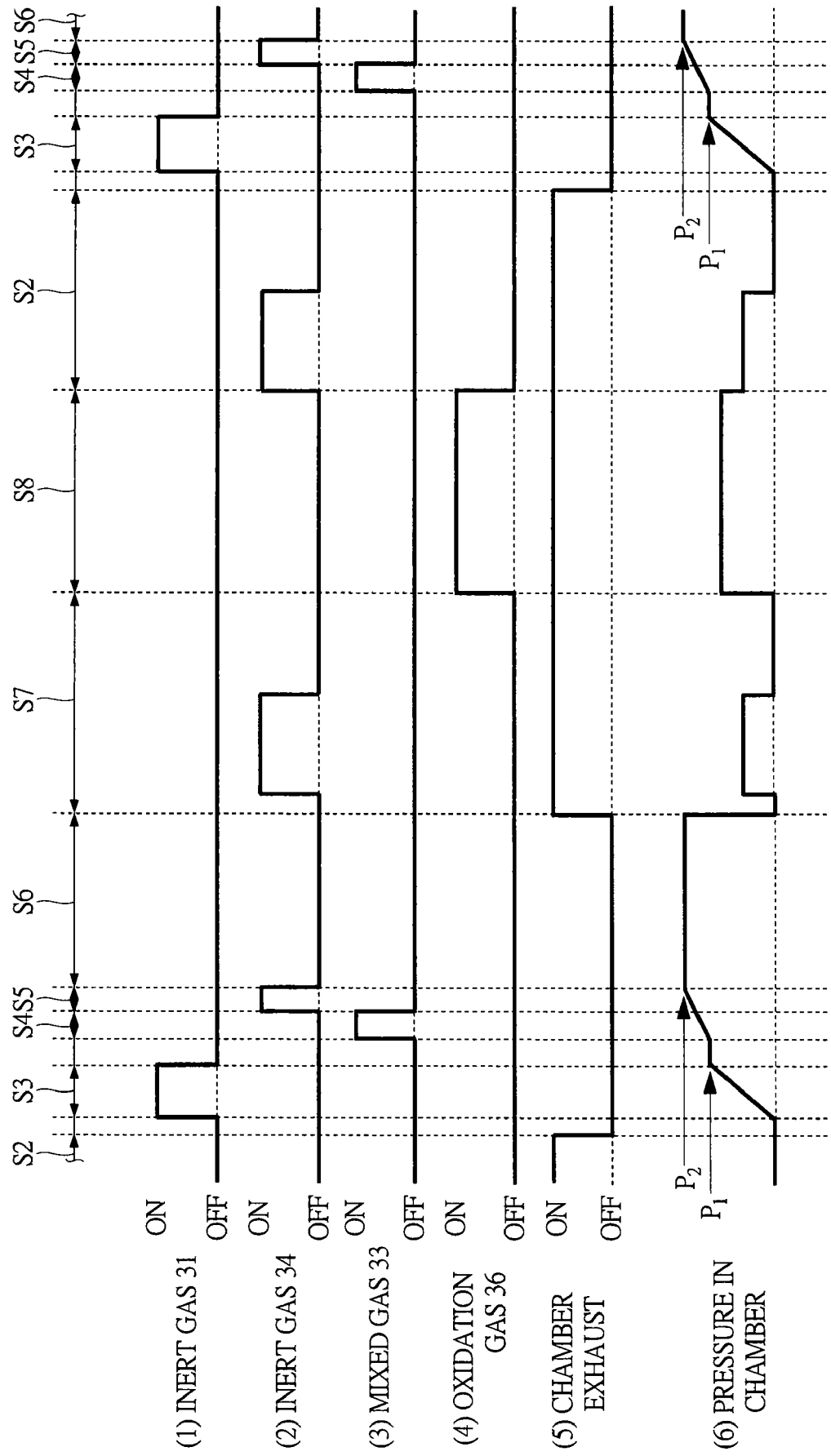
FIG. 3 is an illustrative diagram showing a timing chart of the process of forming a metal oxide film on a semiconductor wafer according to the embodiment of the present invention.

FIG. 2 is a manufacturing process flow chart of the process of forming the metal oxide film 2 on the semiconductor wafer 1W. FIG. 3 is an illustrative diagram showing a timing chart of the process of forming the metal oxide film 2 on the semiconductor wafer 1W. FIGS. 4 to 10 are illustrative diagrams showing the film-deposition apparatus 11 in each step of the process of forming the metal oxide film 2 on the semiconductor wafer 1W. For the sake of simplification of understanding, through FIGS. 4 to 10, for each of the valves 19, 20, 21a, 21b, 21c, 21d, 24a, 24b, 24c, and 25, an open state of the valve is schematically represented by a white circle, whilst a closed state of the valve is schematically represented by a black circle.

Note that, in FIG. 3, "(1) INERT GAS 31" represents a timing of introducing the inert gas 31 from the gas path 16 to the chamber 12, where OFF corresponds to the state in which the valve 19 is closed and the inert gas 31 is not introduced from the gas path 16 into the chamber 12, and ON corresponds to the state in which the valve 19 is open and the inert gas 31 is introduced from the gas path 16 into the chamber 12. And, in FIG. 3, "(2) INERT GAS 34" represents a timing of introducing the inert gas 34 from the gas path 18b to the chamber 12, where OFF corresponds to the state in which switching the valve 21 causes the inert gas 34 not to be introduced from the gas path 18b into the chamber 12, and ON corresponds to the state in which switching the valve 21 causes the inert gas 34 to be introduced from the gas path 18b into the chamber 12. Furthermore, in FIG. 3, "(3) MIXED GAS 33" represents a timing of introducing the mixed gas 33 of the inert gas and the source gas from the gas path 18a to the chamber 12, where OFF corresponds to the state in which switching the valve 21 causes the mixed gas 33 not to be introduced from the gas path 18a into the chamber 12, and ON corresponds to the state in which switching of the valve 21 causes the mixed gas 33 to be introduced from the gas path 18a into the chamber 12. Still further, in FIG. 3, "(4) OXIDATION GAS 36" represents a timing of introducing an oxidation gas 36 from the gas path 17 into the chamber 12, where OFF corresponds to the state in which the valve 20 is closed and the oxidation gas 36 is not introduced from the gas path 17 into the chamber 12, and ON corresponds to the state in which the valve 20 is open and the oxidation gas 36 is introduced from the gas path 17 into the chamber 12. Still further, in FIG. 3, "(5) CHAMBER EXHAUST" represents a timing of exhausting the gas in the chamber 12 from the gas exhaust outlet 14, where OFF corresponds to the state in which the gate valve 15 is closed and (the gas in) the chamber 12 is not exhausted from the gas exhaust outlet 14, and ON corresponds to the state in which the gate valve 15 is open and (the gas in) the chamber 12 is exhausted from the gas exhaust outlet 14. Moreover, in FIG. 3, "(6) IN-CHAMBER PRESSURE" represents the pressure in the chamber 12.

In the process of forming the metal oxide film 2 on the semiconductor wafer 1W, the semiconductor wafer 1W on which the metal oxide film 2 is to be formed (semiconductor wafer 1W before formation of the metal oxide film 2) is first placed on the wafer stage 13 in the chamber 12 (step S1).

Figure 4:
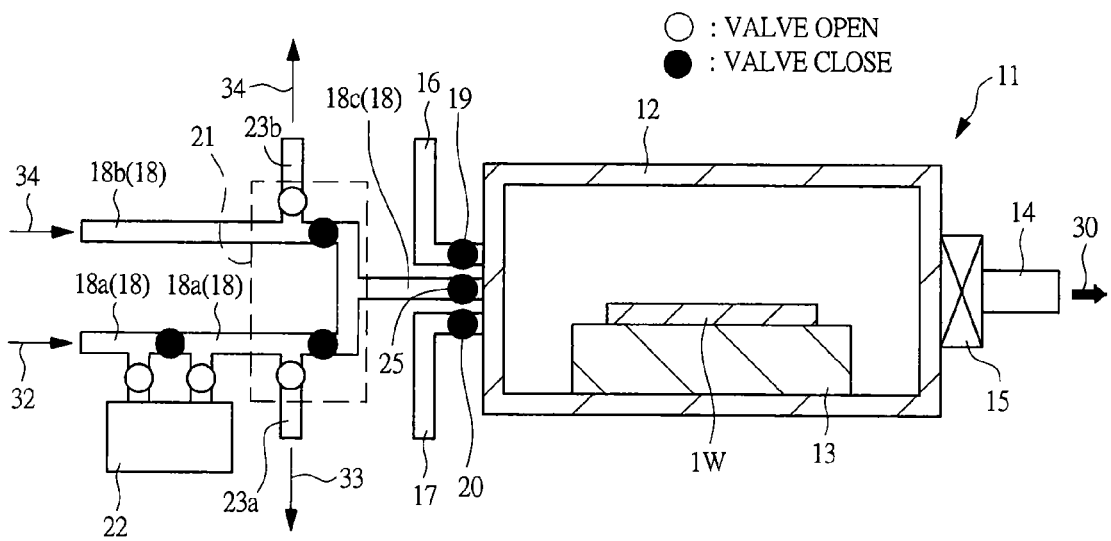
FIG. 4 is an illustrative diagram showing a film-deposition apparatus in a step S2 of the process of forming a metal oxide film on a semiconductor wafer according to an embodiment of the present invention.

Next, with the gate valve 15 open, (the gas in) the chamber 12 is exhausted (vacuum-exhausted) from the gas exhaust outlet 14 (step S2). That is, in step S2, the gas in the chamber 12 in which the semiconductor wafer 1W is placed is exhausted (discharged, eliminated, purged) from the gas exhaust outlet 14 to the outside of the chamber 12. FIG. 4 corresponds to the film-deposition apparatus 11 at the stage of step S2. In step S2, exhaust of the chamber 12 is performed from the gas exhaust outlet 14. In FIGS. 4 to 10, an exhaust 30 of the chamber 12 from the gas exhaust outlet 14 is schematically represented by an arrow. Note that, in the present application, "exhaust of the chamber", "exhaust the chamber" and the like mean that "the gas in the chamber is exhausted to the outside of the chamber".

Also in step S2, it is more preferable that an inert gas from one or both of the gas path 17 and the gas paths 18b, 18c is temporarily introduced into the chamber 12 for the purpose of purging while the gas in the chamber 12 is exhausted from the gas exhaust outlet 14 to the outside of the chamber 12. In this manner, unnecessary gas (gas other than the inert gas) can be more adequately prevented from being left in the chamber 12. Note that, the timing chart of FIG. 3 shows that, in step S2, the inert gas 34 is introduced into the chamber 12 from the gas paths 18b, 18c for the purpose of purging.

And, after the semiconductor wafer 1W is placed on the wafer stage 13 in step S1, the semiconductor wafer 1W is heated by a heater or the like embedded in the wafer stage 13. Alternatively, heating of the semiconductor wafer 1W may be started after the start of exhaust in step S2.

Figure 5:
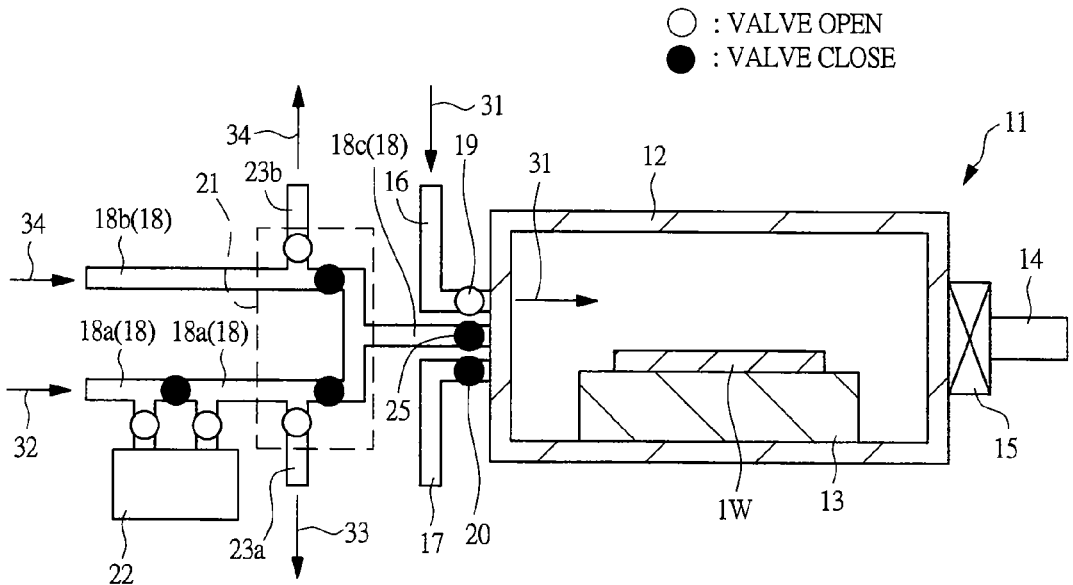
FIG. 5 is an illustrative diagram showing the film-deposition apparatus in a step S3 continued from FIG. 4.

After (the gas in) the chamber 12 is exhausted in step S2, an inert gas is introduced from the gas path 16 into the chamber 12 (step S3). FIG. 5 corresponds to the film-deposition apparatus 11 at the stage of step S3. That is, in step S3, the inert gas 31 fed to the gas path 16 is introduced into the chamber 12 with the valve 19 open.

As the inert gas 31 to be introduced into the chamber 12 in step S3, nitrogen ($N_2$) gas, argon (Ar) gas, or helium (He) gas can be used, for example. It is more preferable to use argon (Ar) gas, because unnecessary reaction can be appropriately prevented at low cost. Depending on the capacity of the chamber 12 and gas flow rate, the time for introducing the inert gas 31 into the chamber 12 in step S3 can be on the order of five seconds, for example.

In step S3, the inert gas 31 is introduced into the chamber 12 in which the semiconductor wafer 1W is placed to set the pressure in the chamber 12 at a pressure $P_1$ (first pressure) of 133 Pa (1 Torr) or higher and lower than 101325 Pa (1 atmospheric pressure, 760 Torr) (that is, 133 Pa $\leq P_1 <$ 101325 Pa). This pressure $P_1$ is more preferably 667 Pa (5 Torr) or higher (that is, $P_1 \geq$ 667 Pa). Also, this pressure $P_1$ is preferably 2666 Pa or lower (20 Torr) (that is, $P_1 \leq$ 2666 Pa) and, more preferably, 1333 Pa (10 Torr) or lower (that is, $P_1 \leq$ 1333 Pa). The reason for such a range of the pressure $P_1$ will be described in detail further below, and therefore is not described here. In step S3, the inside of the chamber 12 is set to be in the state where only the inert gas (inert gas 31) is substantially introduced, and the pressure $P_1$ inside of the chamber 12 when the introduction of the inert gas 31 into the chamber 12 ends is set within the above range.

And, it is not easy to control the pressure $P_1$ inside of the chamber 12 in a relatively high-pressure state as described above while (the gas in) the chamber 12 is exhausted. Accordingly, in step S2, the gate valve 15 is made open to exhaust (the gas in) the chamber 12 so that the pressure inside of the chamber 12 is decreased to a predetermined low-pressure state (for example, on the order of 13.3 Pa (0.1 Torr) or lower), and then, the gate valve 15 is closed. In step S3, the inert gas 31 is introduced into the chamber 12 in the state without gas exhaust. In this manner, the amount (gas flow rate and gas introduction time) of the inert gas 31 to be introduced from the gas path 16 into the chamber 12 in step S3 is adjusted, thereby easily and adequately controlling the pressure $P_1$ inside of the chamber 12 after introduction of the inert gas 31 at a desired value within the above-said range.

And, in the present embodiment, the gas path 16 is provided for inert-gas introduction to introduce the inert gas 31 from the gas path 16 into the chamber 12 in step S3. As another embodiment, the gas path 16 can be omitted, and the inert gas (inert gas 34) can be introduced in step S3 from the gas paths 18b, 18c into the chamber 12. In this manner, the number of gas paths connected to the chamber 12 can be reduced, thereby simplifying the structure of the film-deposition apparatus 11. On the other hand, if the gas path 16 is provided as the present embodiment, the conditions (for example, the flow rate) for introducing the inert gas 34 into the chamber 12 in step S3 can differ from the conditions (for example, the flow rate) for the inert gas 34 in step S5, which will be described further below, thereby easily adjusting the conditions for introducing the inert gas into the chamber 12 suitable to each step.

Figure 6:
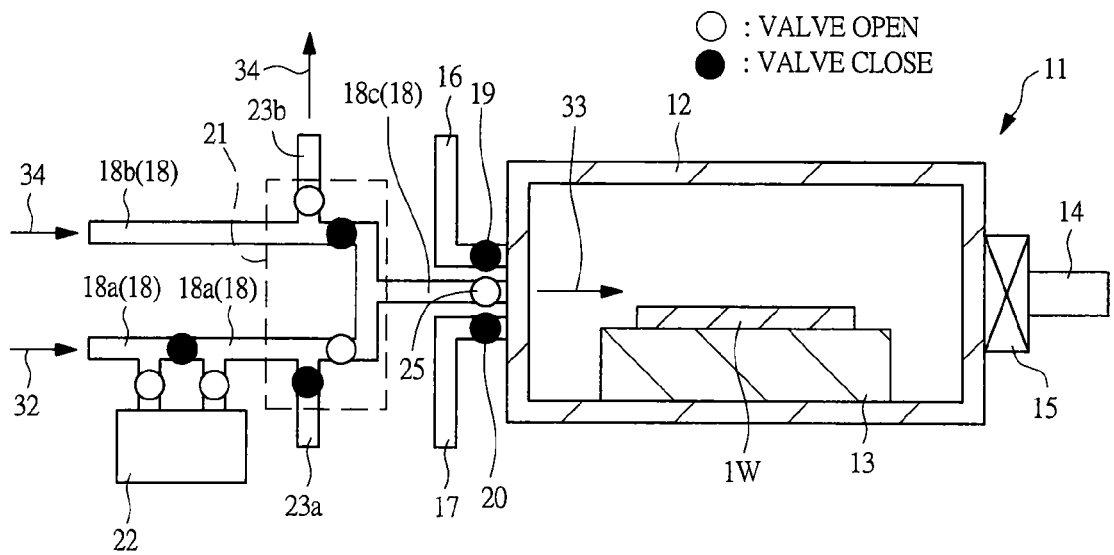
FIG. 6 is an illustrative diagram showing the film-deposition apparatus in a step S4 continued from FIG. 5.

Into the chamber 12 having the inert gas introduced in step S3 to be set at the pressure $P_1$, a gas containing a source gas (metal source gas) for depositing the metal oxide film 2 is introduced from the gas paths 18a, 18c (step S4). FIG. 6 corresponds to the film-deposition apparatus 11 at the stage of step S4.

The source gas for depositing the metal oxide film 2 (hereinafter, it may simply referred to as "source gas") comprises a metal compound (metal compound molecules) containing a metal element forming the metal oxide film 2. For example, when the metal oxide film 2 is a lanthanum oxide film, the source gas comprises a lanthanum compound. Preferred types of the source gas will be described in detail further below.

To the gas path 18a, the inert gas 32 for carrier is fed. This inert gas 32 is mixed with the source gas for depositing the metal oxide film 2 in the deposition source chamber 22 to become the mixed gas 33 of the inert gas and the source gas. This mixed gas 33 goes through the gas path 18a after going out from the deposition source chamber 22 and, in step S4, further goes through the gas path 18c to be introduced into the chamber 12. Since this mixed gas 33 is a mixed gas of the inert gas 32 and the source gas for depositing the metal oxide film 2, the mixed gas 33 contains the source gas for depositing the metal oxide film 2. Note that, in the steps other than step S4, this mixed gas 33 does not go through the gas path 18c but is exhausted from the exhaust path 23a. As the inert gas 32, nitrogen ($N_2$) gas, argon (Ar) gas, or helium (He) gas can be used, for example. More preferably, argon (Ar) gas is used, because unnecessary reaction can be adequately prevented at low cost.

In step S4, the switching valve 21 is switched so that an inflow of the gas (inert gas 34) from the gas path 18b to the gas path 18c is interrupted, an exhaust of the gas (mixed gas 33) from the gas path 18a to the exhaust path 23a is interrupted, and an inflow of the gas (mixed gas 33) from the gas path 18a to the gas path 18c is permitted. And, the valve 25 is set open to permit an inflow of the gas (mixed gas 33) from the gas path 18c to the chamber 12. And, the valves 19, 20 closed. Therefore, in step S4, while the mixed gas 33 of the source gas for depositing the metal oxide film 2 and the inert gas is introduced via the gas path 18a and the gas path 18c into the chamber 12, other gases are substantially not introduced into the chamber 12. The mixed gas 33 introduced into the chamber 12 in step S4 preferably comprises the inert gas and the source gas for depositing the metal oxide film 2, and it is preferable not to comprise the other gas components.

Alternatively, without using the inert gas 32 for carrier, in step S4, only the source gas for depositing the metal oxide film 2 in place of the mixed gas 33 can be introduced from the gas paths 18a, 18c into the chamber 12. However, as in the present embodiment, it is more preferable to use the inert gas 32 for carrier and introduce the mixed gas 33 of the inert gas 32 and the source gas for depositing the metal oxide film 2 from the gas paths 18a, 18c into the chamber 12 in step S4 because the source gas can be stably introduced into the chamber 12.

Furthermore, as with step S3, also in step S4, the gate valve 15 is closed to make (the gas in) the chamber 12 not exhausted. Therefore, in step S4, in the chamber 12 having the pressure $P_1$ without gas exhaust, a gas containing the source gas for depositing the metal oxide film 2 (here, mixed gas 33) will be introduced. Depending on the capacity of the chamber 12 and gas flow rate, the time for introducing the mixed gas 33 into the chamber 12 in step S4 can be on the order of one to three seconds, for example.

Figure 7:
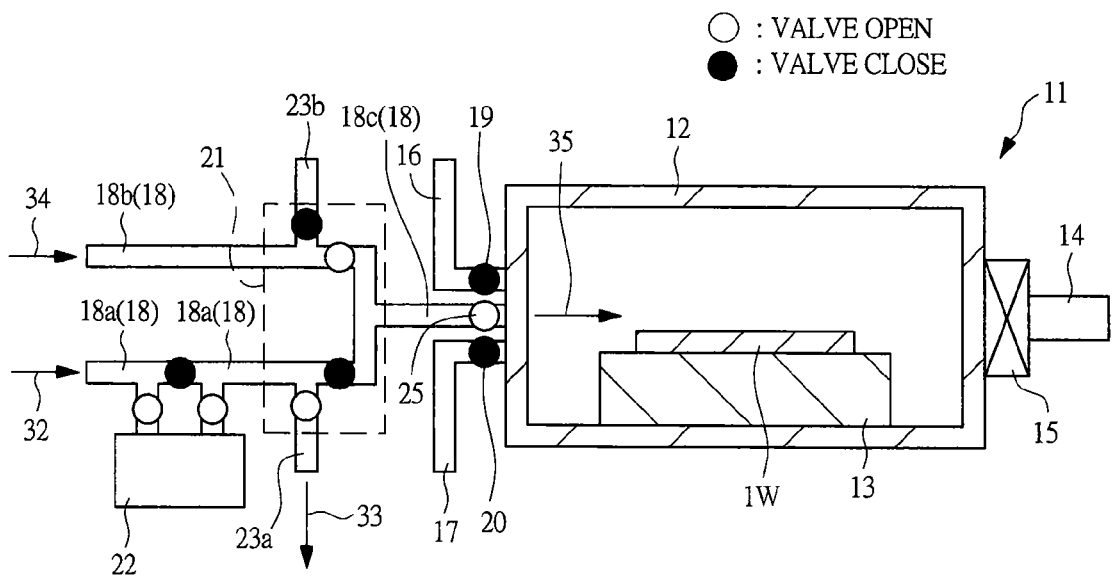
FIG. 7 is an illustrative diagram showing the film-deposition apparatus in a step S5 continued from FIG. 6.

After step S4, the switching valve 21 is switched to the state in which an inflow of the gas (mixed gas 33) from the gas path 18a to the gas path 18c is interrupted and an inflow of the gas (inert gas 34) from the gas path 18b to the gas path 18c is permitted. Then, in the chamber 12, the gas 35 containing the source gas for depositing the metal oxide film 2 is introduced from the gas paths 18b, 18c (step S5). FIG. 7 corresponds to the film-deposition apparatus 11 at the stage of step S5.

To the gas path 18b, the inert gas 34 for purging is fed. This inert gas 34 does not contain a source gas. In step S5, the inert gas 34 fed to the gas path 18b goes through the gas path 18b, and then further goes through the gas path 18c to be introduced into the chamber 12 without being exhausted from the exhaust path 23b. At this time, among the mixed gas 33 of the source gas and the inert gas introduced from the gas path 18a to the gas path 18c in step S4, part of them that is not introduced into the chamber 12 and remains in the gas path 18c is introduced in step S5 into the chamber 12 together with the inert gas 34 fed from the gas path 18b to the gas path 18c. That is, in step S5, the inert gas 34 is introduced into the chamber 12 via the gas path 18b and the gas path 18c, and the mixed gas 33 introduced into the gas path 18c in step S4 is also introduced into the chamber 12 in step S5 together with the inert gas 34.

Therefore, the gas 35 to be introduced into the chamber 12 in step S5 is formed of the inert gas 34 and the mixed gas 33. As described above, since the mixed gas 33 is formed of the inert gas and the source gas for depositing the metal oxide film 2, the gas 35 to be introduced into the chamber 12 in step S5 is formed of the inert gas and the source gas for depositing the metal oxide film 2, and substantially does not contain other gas components. That is, the gas 35 to be introduced into the chamber 12 in step S5 contains the source gas for depositing the metal oxide film 2. Also, as the inert gas 34, nitrogen ($N_2$) gas, argon (Ar) gas, or helium (He) gas can be used, for example. More preferably, argon (Ar) gas is used, because unnecessary reaction can be adequately prevented at low cost.

In step S5, the switching valve 21 is switched so that an inflow of the gas from the gas path 18a to the gas path 18c is interrupted, the mixed gas 33 from the gas path 18a is exhausted from the exhaust path 23a, exhaust of the gas from the gas path 18b to the exhaust path 23c is interrupted, and an inflow of the gas (here, inert gas 34) from the gas path 18b to the gas path 18c is permitted. Also, the valve 25 is set open to permit an inflow of the gas (here, gas 35) from the gas path 18c to the chamber 12. Furthermore, the valves 19, 20 are closed. Therefore, in step S5, the gas 35 containing the source gas for depositing the metal oxide film 2 is introduced from the gas paths 18b, 18c into the chamber 12, and other gases are substantially not introduced into the chamber 12. Still further, as with steps S3, S4, the gate valve 15 is closed and the gas in the chamber 12 is not exhausted to the outside of the chamber 12 in step S5. Depending on the capacity of the chamber 12 and gas flow rate, the time for introducing the gas 31 into the chamber 12 in step S5 can be on the order of two to four seconds, for example.

In this manner, through steps S4 and S5, the source gas for depositing the metal oxide film 2 is introduced into the chamber 12.

Also, from step S3 to step S5, the gate valve 15 is closed so as not to exhaust the chamber 12. Therefore, the pressure in the chamber 12 is same from the end of introduction of the inert gas 31 into the chamber 12 in step S3 to the start of introduction of the mixed gas 33 into the chamber 12 in step S4, that is, the pressure $P_1$. However, after the introduction of the mixed gas 33 into the chamber 12 in step S4 is started, the pressure in the chamber 12 is increased by the introduced gases (mixed gas 33 and gas 35). That is, with the mixed gas 33 and the gas 35 being introduced into the chamber 12 in steps S4 and S5, the pressure in the chamber 12 becomes higher than the pressure $P_1$. For example, with the mixed gas 33 and the gas 35 being introduced into the chamber 12 in steps S4, S5, the pressure in the chamber 12 is increased to become larger than pressure $P_1$ by in the order of 133 Pa to 2666 Pa (1 to 20 Torr), for example, 1333 Pa (10 Torr).

Figure 8:
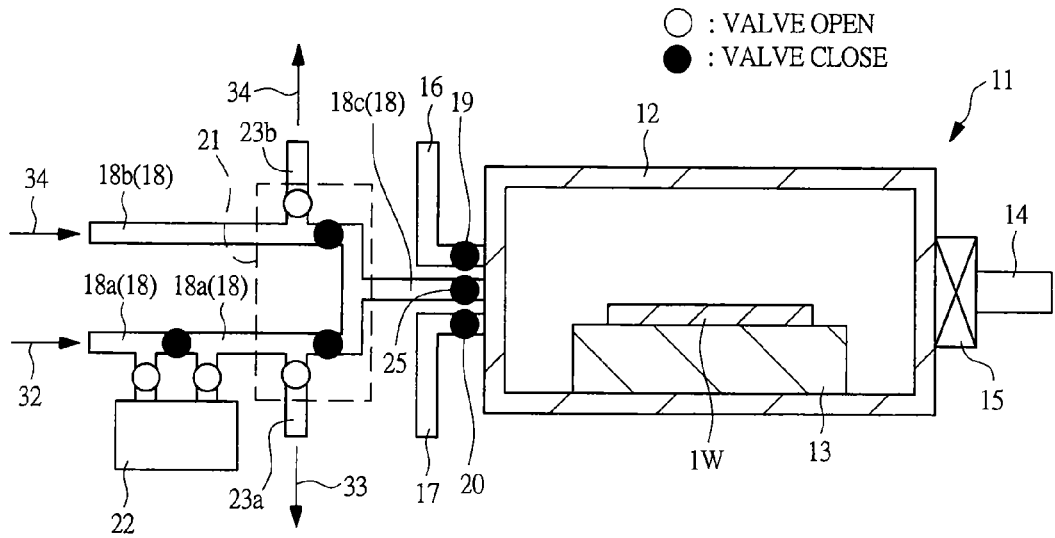
FIG. 8 is an illustrative diagram showing the film-deposition apparatus in a step S6 continued from FIG. 7.

After step S5, the switching valve 21 is switched to interrupt a gas inflow into the chamber 12, and then the state is maintained for a predetermined time where the source gas for depositing the metal oxide film 2 is present (has been introduced) in the chamber 12 (step S6). FIG. 8 corresponds to the film-deposition apparatus 11 at the stage of step S6.

During step S6, no gas is introduced into the chamber 12, and the gate valve 15 is closed to prevent the gas in the chamber 12 from being exhausted outside of the chamber 12. That is, in step S6, the state is maintained where gas introduction into and exhaust from the chamber 12 are not performed, and the source gas is present in the chamber 12, so that the inside of the chamber 12 is in a static atmosphere. In this manner, the gas in the chamber 12 is stabilized, and the molecules of the source gas tend to be absorbed onto the surface of the semiconductor wafer 1W. Also, step S6 is preferably performed for on the order of one to ten seconds. In this manner, absorption of the molecules of the source gas onto the surface of the semiconductor wafer 1W can be promoted. Also, it is possible to prevent an increase in time required for deposition which reduces throughput.

Figure 9:
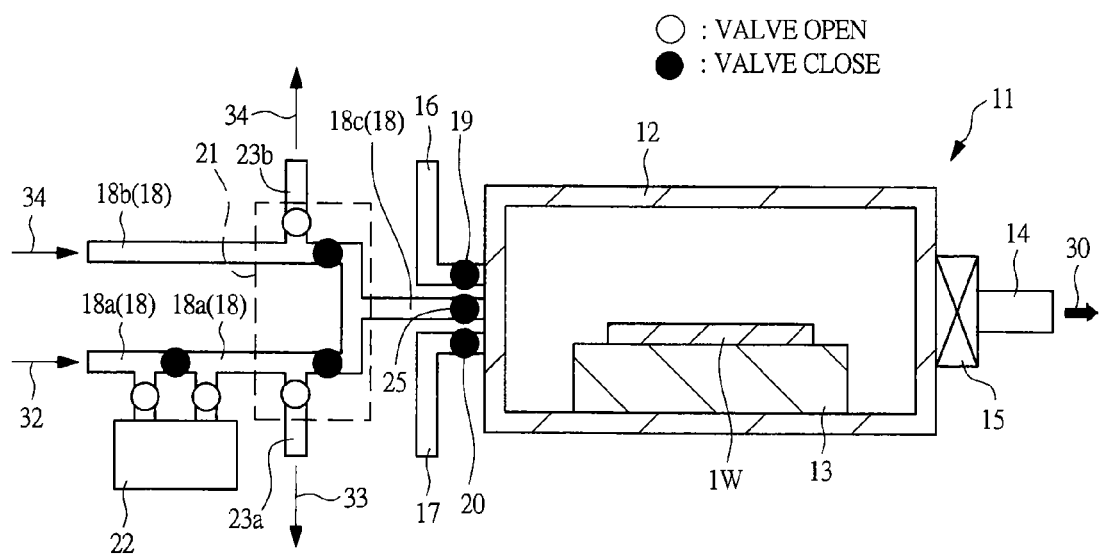
FIG. 9 is an illustrative diagram showing the film-deposition apparatus in a step S7 continued from FIG. 8.

After step S6, the gate valve 15 is open to exhaust (vacuum-exhaust) (the gas in) the chamber 12 from the gas exhaust outlet 14 (step S7). That is, in step S7, the gas in the chamber 12 is exhausted (discharged, eliminated, purged) from the gas exhaust outlet 14 to the outside of the chamber 12. FIG. 9 corresponds to the film-deposition apparatus 11 at the stage of step S7.

In steps S4 and S5, the source gas for depositing the metal oxide film 2 (source gas contained in the mixed gas 33 and the gas 35) is introduced into the chamber 12. This source gas is eliminated (exhausted) in step S7 from the gas exhaust outlet 14 to the outside of the chamber 12. That is, in step S7, the source gas in the chamber 12 is exhausted (discharged, eliminated, purged) to the outside of the chamber 12. In step S7, however, while the source gas not absorbed onto the surface of the semiconductor wafer 1W is exhausted from the gas exhaust outlet 14 to the outside of the chamber 12, the molecules of the source gas absorbed onto the surface of the semiconductor wafer 1W in steps S4 to S6 are not eliminated to the outside of the chamber 12 in step S7, but are left as being absorbed onto the surface of the semiconductor wafer 1W. Therefore, in step S7, the absorbed molecules of the source gas are left on the semiconductor wafer 1W.

Also in step S7, more preferably, while (the gas in) the chamber 12 is exhausted from the gas exhaust outlet 14, an inert gas from one or both of the gas path 17 and the gas paths 18b, 18c is temporarily introduced into the chamber 12 for the purpose of purging. In this manner, unnecessary gas (gas other than the inert gas; for example, a source gas not absorbed onto the semiconductor wafer 1W) can be more appropriately prevented from being left in the chamber 12. Note that, the timing chart of FIG. 3 shows the case where the inert gas 34 is introduced into the chamber 12 from the gas paths 18b, 18c for the purpose of purging in step S2.

Figure 10:
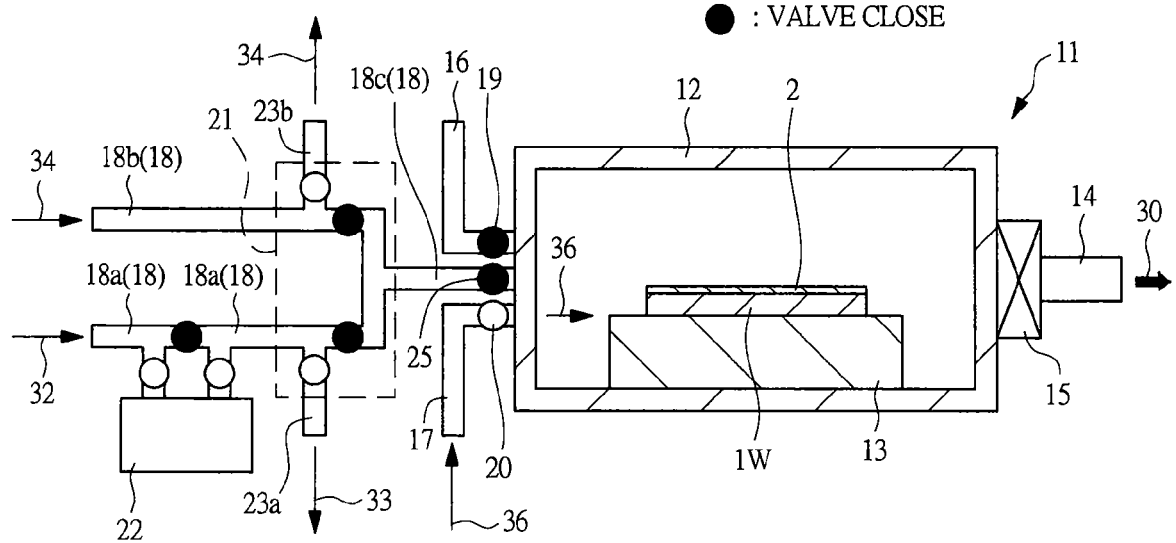
FIG. 10 is an illustrative diagram showing the film-deposition apparatus in a step S8 continued from FIG. 9.

After step S7, the oxidation gas 36 is introduced from the gas path 17 into the chamber 12 (step S8). That is, in step S8, the oxidation gas 36 fed to the gas path 17 is introduced into the chamber 12 with the valve 20 being set open. FIG. 10 corresponds to the film-deposition apparatus 11 at the stage of step S8.

In step S8, the source gas molecules absorbed onto the semiconductor wafer 1W (molecules of the source gas for depositing the metal oxide film 2) react with the oxidation gas 36 introduced into the chamber 12 to form the metal oxide film 2 on the semiconductor wafer 1W. Although the source gas molecules absorbed onto the semiconductor wafer 1W reacts with the oxidation gas 36 to form the metal oxide film 2, the source gas molecules absorbed onto the semiconductor wafer 1W are only of a monomolecular layer or the like, and thus a metal oxide film formed in step S8 is like one atomic layer. As the oxidation gas (oxygen source gas, oxidizer gas) to be introduced into the chamber 12 in step S8, $O_2$ (oxygen) gas, $O_3$ (ozone) gas, or $H_2O$ (water vapor) gas can be used, for example. Also, in step S8, although a single gas as an oxidation gas can be introduced from the gas path 17 into the chamber 12, the oxidation gas can be introduced from the gas path 17 into the chamber 12 together with a carrier gas (preferably, inert gas). In this case, a mixed gas of the oxidation gas and the inert gas is introduced from the gas path 17 into the chamber 12. Furthermore, in step S8, the oxidation gas 36 can be introduced into the chamber 12 while the gate valve 15 is open and the gas in the chamber 12 is exhausted from the gas exhaust outlet 14 to the outside of the chamber 12.

Then, steps S2 through S8 are repeated (that is, with taking these steps S2 through S8 as one cycle, a plurality of such cycles are performed). In this manner, the metal oxide film 2 is deposited (formed) by one atomic layer or the like at per cycle on the semiconductor wafer 1W. In this manner, the metal oxide film 2 having a desired film thickness can be formed on the semiconductor wafer 1W.

More particularly, after step S8, if the film thickness of the metal oxide film 2 on the semiconductor wafer 1W is not enough to satisfy the desired film thickness, the procedure returns to step S2, and steps S2, S3, S4, S5, S6, S7, S8 are preformed again. If the film thickness of the metal oxide film 2 on the semiconductor wafer 1W is still not enough to satisfy the desired film thickness, the procedure returns to step S2 again, and steps S2, S3, S4, S5, S6, S7, S8 are preformed again. This process is repeated until the film thickness of the metal oxide film 2 on the semiconductor wafer 1W becomes the desired one.

While the cycle of steps S2 through S8 is repeated to deposit the metal oxide film 2, the semiconductor wafer 1W is continued to be heated by the wafer stage 13 so that the semiconductor wafer 1W is kept at a predetermined film-deposition temperature. And, when the cycle of steps S2 through S8 is repeated, as step S2 is performed after step S8, a non-reacted portion of the oxidation gas 36, a by-product left in the chamber 12, and others are exhausted (discharged, eliminated, purged) from the gas exhaust outlet 14 to the outside of the chamber 12.

After the cycle of steps S2 through S8 is repeated for a required number of times to deposit the metal oxide film 2 having the desired film thickness on the semiconductor wafer 1W, the semiconductor wafer 1W is taken out from the chamber 12. Then, a thermal treatment can be performed on the semiconductor wafer 1W as required to improve the film quality of the metal oxide film 2.

Figure 24:
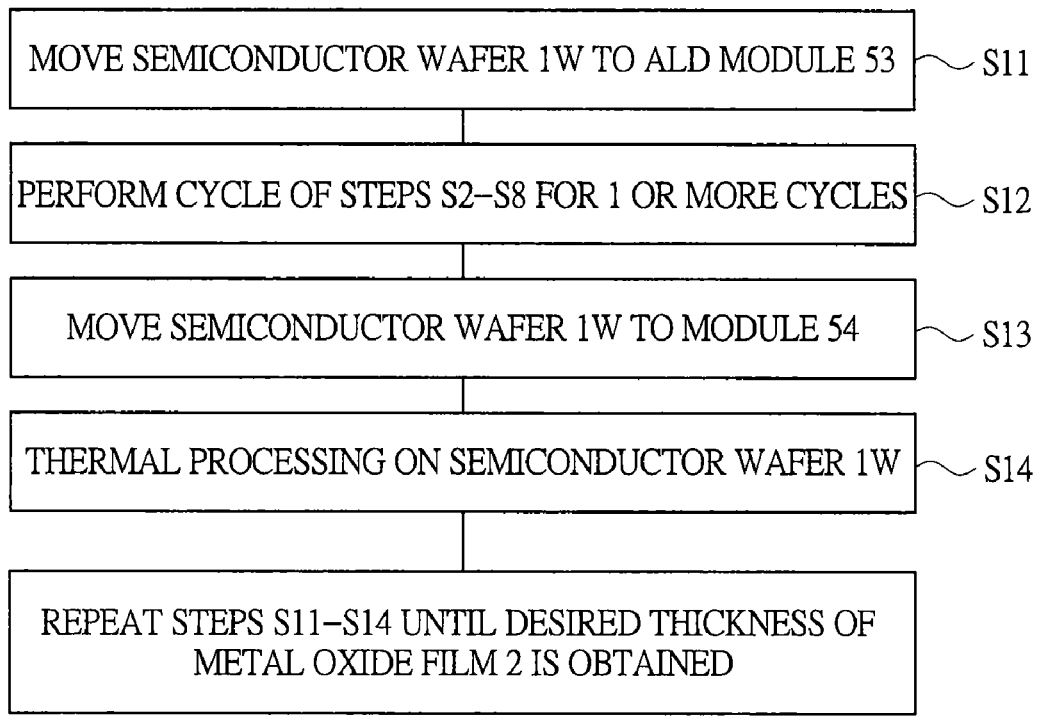
FIG. 24 is a manufacturing process flow chart showing a process of forming a metal oxide film on a semiconductor wafer according to another embodiment of the present invention.

Furthermore, in place of performing a thermal treatment after repeating the cycle of steps S2 through S8 until the final film thickness of the metal oxide film 2 is obtained (a stage where no more metal oxide film 2 is deposited) to complete the deposition of the metal oxide film 2, the thermal treatment can be performed during the cycle of steps S2 through S8 is repeated as shown in FIG. 24. It be described further below, and therefore are not described here.

In the present embodiment, as making the semiconductor wafer 1W heated by the heater or the like embedded in the wafer stage 13 to become at a predetermined film-deposition temperature (for example, 200° C. to 400° C.), the cycle of steps S2 through S8 is repeated to form (deposit) the metal oxide film 2 on the semiconductor wafer 1W. Since the semiconductor wafer 1W in step S8 is heated to react with the source gas molecules absorbed onto the semiconductor wafer 1W and the oxidation gas introduced into the chamber 12 to form the metal oxide film 2, the principles of film deposition of the metal oxide film 2 is substantially similar to those of a thermal CVD (Chemical Vapor Deposition) method. In the present embodiment, however, every time the cycle of steps S2 through S8 is repeated, the metal oxide film 2 is sequentially deposited by one atomic layer or the like. Therefore, the metal oxide film 2 can be regarded to be formed through an ALD (Atomic Layer Deposition, Atomic Layer Controlled Deposition) method.

Next, effects of the present embodiment are described in more detail.

Figure 11:
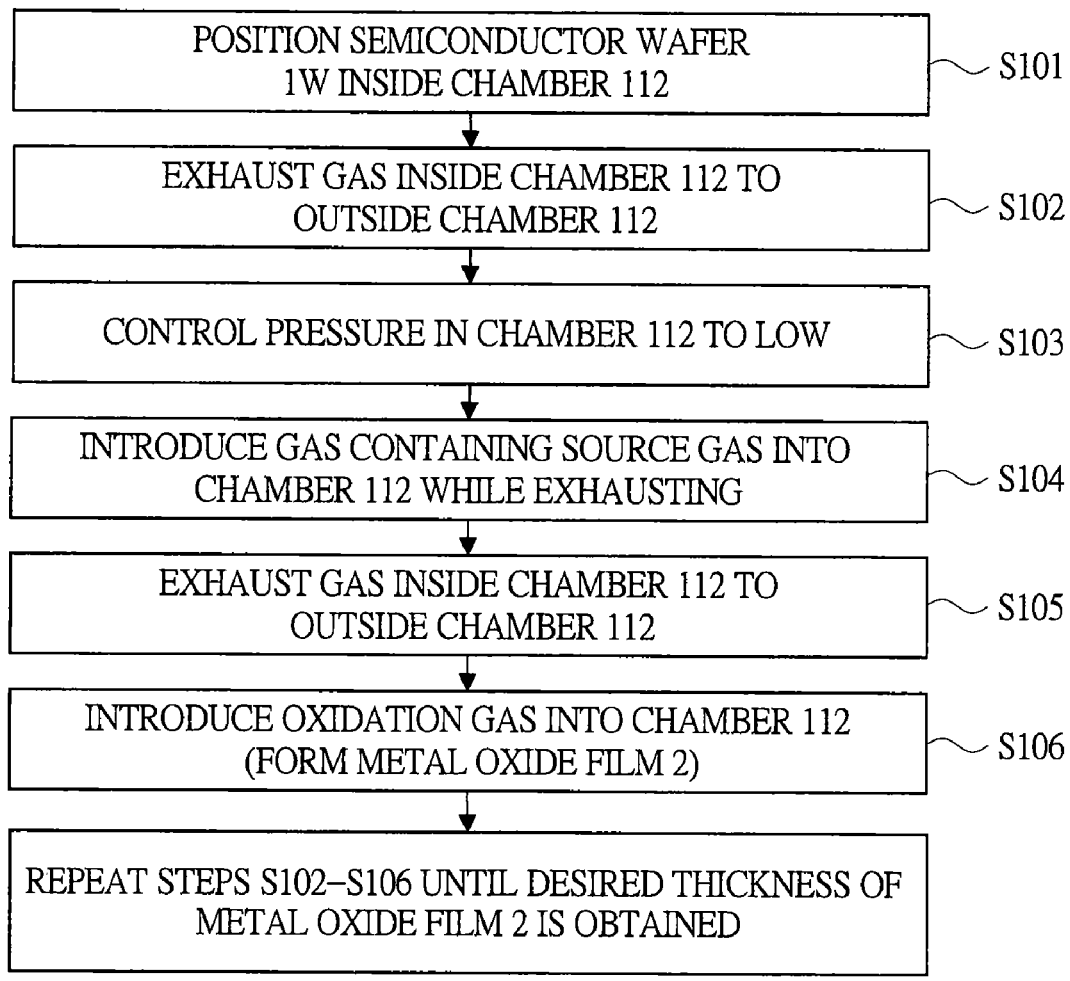
FIG. 11 is a manufacturing process flow chart showing a process of forming a metal oxide film on a semiconductor wafer according to a comparative example.
Figure 12:
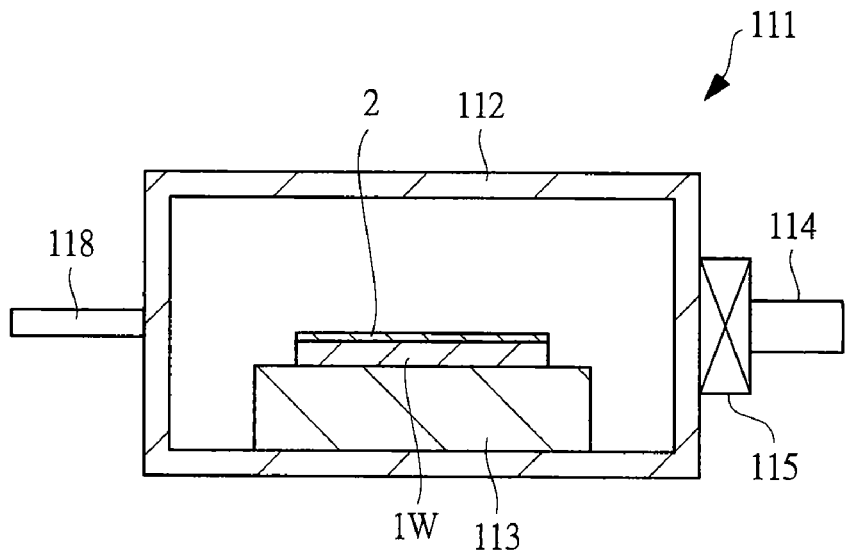
FIG. 12 is an illustrative diagram showing a conceptual structure of a film-deposition apparatus for use in the process of forming a metal oxide film on a semiconductor wafer according to the comparative example.

FIG. 11 is a manufacturing process flow of a step of forming the metal oxide film 2 on the semiconductor wafer 1W in a comparative example, corresponding to FIG. 2 in the present embodiment. FIG. 12 is an illustrative diagram showing a conceptual structure of a film-deposition apparatus 111 for use in the step of forming the metal oxide film 2 on the semiconductor wafer 1W in the comparative example, corresponding to FIG. 1 in the present embodiment.

The film-deposition apparatus 111 shown in FIG. 12 includes a chamber 112, a wafer stage 113, a gas exhaust outlet 114, and a gate valve 115, which have substantially similar structures and functions of the chamber 12, the wafer stage 13, the gas exhaust outlet 14, and the gate valve 15 of the film-deposition apparatus 11 described above, respectively. In FIG. 12, however, although the film-deposition apparatus 111 having only one gas path 118 for introducing a gas into the chamber 112 is shown for simplification of understanding, the gas path 118 can be connected to the chamber 112 in practice as many as the types of gases to be introduced to the chamber 112.

In the process of the comparative example, steps S101, S102 are first performed, which are approximately similar to steps S1, S2 described above. Since steps S101, S102 are similar to steps S1, S2 described above, they are not described here.

After step S102, while (the gas in) the chamber 112 is exhausted from the gas exhaust outlet 114 and an inert gas is introduced from the gas path 118 to the chamber 112, the gate valve 115 is adjusted so that the pressure inside the chamber 112 is controlled to be low, that is, about equal to or lower than 13.3 Pa (0.1 Torr) (step S103).

Next, while the exhaust of (the gas in) the chamber 112 from the gas exhaust outlet 114 is continued, a mixed gas of the source gas for depositing a metal oxide film and the inert gas is continuously (successively) introduced from the gas path 118 into the chamber 112 (step S104). Since the exhaust of (the gas in) the chamber 112 from the gas exhaust outlet 114 is still continued in step S104, even introducing the mixed gas of the source gas and the inert gas, the pressure inside the chamber 112 is kept low on the order of 13.3 Pa (0.1 Torr) or lower.

Next, the introduction of the mixed gas of the source gas and the inert gas into the chamber 112 is stopped, and then the chamber 112 is vacuum-exhausted from the gas exhaust outlet 114 (step S105). In step S105, during exhaust of (the gas in) the chamber 112, an inert gas can be temporarily introduced from the gas path 118 into the chamber 112 for the purpose of purging. The source gas for depositing a metal oxide film introduced into the chamber 112 in step S104 is eliminated in step S105 from the gas exhaust outlet 114 to the outside of the chamber 112. However, the source gas molecules absorbed onto the semiconductor device 1W are not eliminated to the outside of the chamber 112 but are left as absorbed onto the surface of the semiconductor wafer 1W.

Next, while the exhaust of (the gas in) the chamber 112 from the gas exhaust outlet 114 is continued, an oxidation gas is introduced from the gas path 118 into the chamber 112 to cause the source gas molecules absorbed on the semiconductor wafer 1W to react with the oxidation gas to form the metal oxide film 2 on the semiconductor wafer 1W (step S106).

Then, by repeating a cycle of steps S102 through S106, the metal oxide film 2 having a desired film thickness is formed on the semiconductor wafer 1W.

Figure 13:
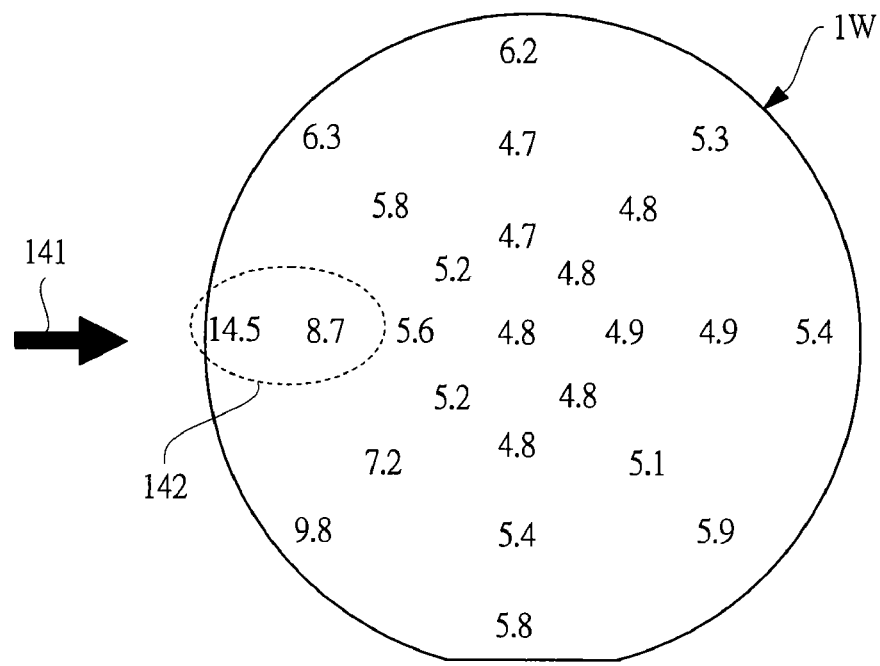
FIG. 13 is an illustrative diagram showing a film-thickness distribution of the metal oxide film formed on the semiconductor wafer in the process according to the comparative example of FIG. 11.
Figure 14:
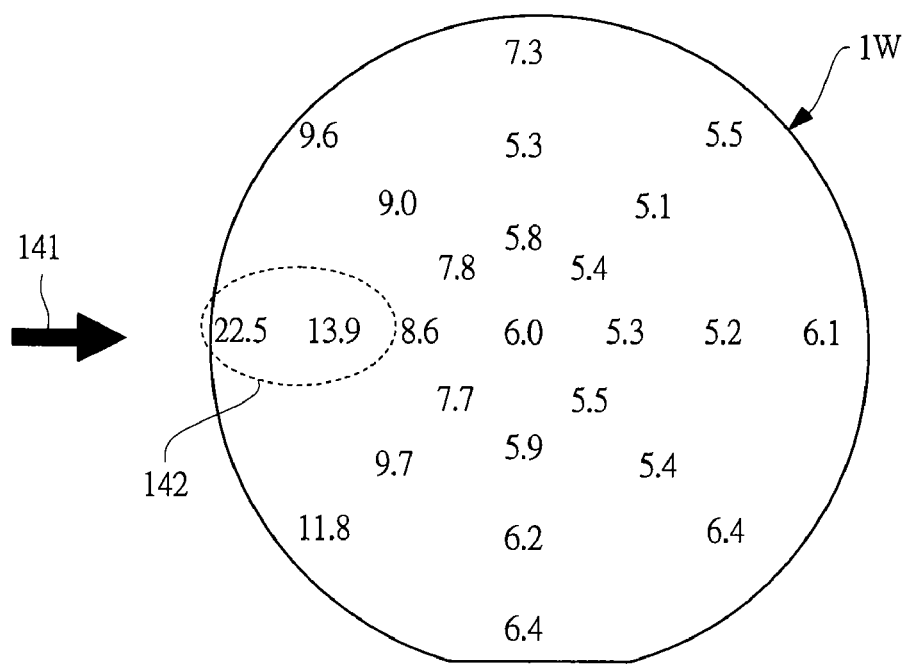
FIG. 14 is an illustrative diagram showing a film-thickness distribution of the metal oxide film formed on the semiconductor wafer in the process according to the comparative example of FIG. 11.
Figure 15:
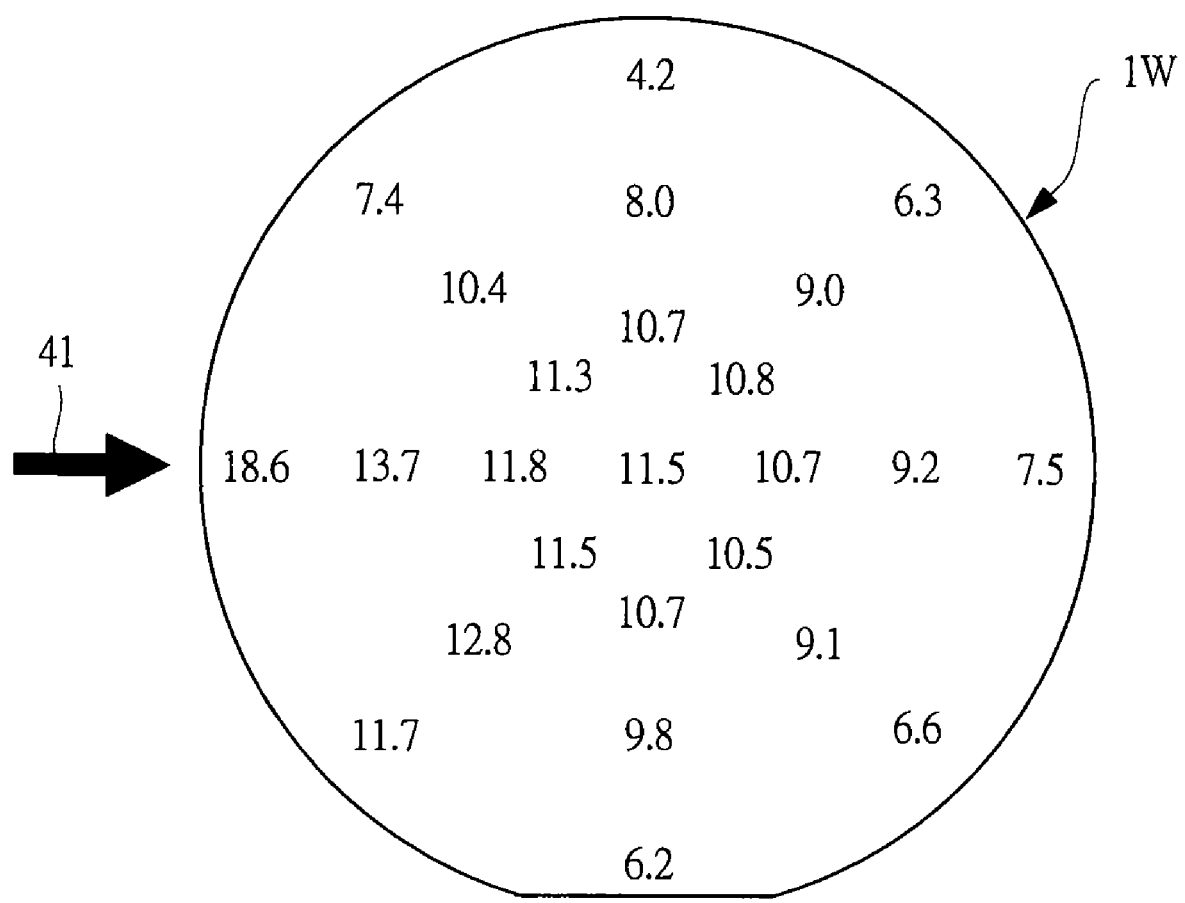
FIG. 15 is an illustrative diagram (plan view) showing a film-thickness distribution of the metal oxide film formed through a process of forming the metal oxide film on the semiconductor wafer according to the embodiment of the present invention.

FIGS. 13 and 14 are illustrative diagrams (plan views) showing film-thickness distributions of the metal oxide film 2 on the semiconductor wafer 1W when the metal oxide film 2 is formed on the semiconductor wafer 1W through the process of the comparative example as shown in FIG. 11. FIG. 15 is an illustrative (plan view) showing a film-thickness distribution of the metal oxide film 2 on the semiconductor wafer 1W when the metal oxide film 2 is formed on the semiconductor wafer 1W according to the present embodiment (FIG. 2). In FIGS. 13 to 15, an upper surface of the semiconductor wafer 1W (a surface on which the metal oxide film 2 is formed) is shown, and each number written therein corresponds to a film thickness of the metal oxide film 2 formed at that position in angstrom unit. Also, as the semiconductor wafer 1W being disposed in the chamber 12, 112, directions 41, 141, from gas inlets (connecting portions of the gas paths 18, 118 and the chambers 12, 112) to the gas exhaust outlets 14, 114 are represented by arrows, respectively. Furthermore, FIGS. 13 to 15 show film-thickness distributions when a La(i-PrCp)$_3$ gas, which will be described further below, is used as the source gas for depositing the metal oxide film 2 to deposit a lanthanum oxide film as the metal oxide film 2. Here, in the present embodiment, the film-thickness distribution of the metal oxide film 2 on the semiconductor wafer 1W means a film-thickness distribution of the metal oxide film 2 inside the main surface of the semiconductor wafer 1W (the main surface side on which a metal oxide film 2 is formed).

When the metal oxide film 2 is formed on the semiconductor wafer 1W through the process of the comparative example, as shown in FIGS. 13 and 14, the film-thickness distribution of the metal oxide film 2 on the semiconductor wafer 1W tends to be uneven. In particular, on the upper surface of the semiconductor wafer 1W, on a side near the gas inlet (connecting portion of the gas path 118 and the chamber 112), the film thickness of the metal oxide film 2 tends to be thicker than other areas (that is, corresponding to the area 142 surrounded by a dotted line in FIGS. 13 and 14). And, FIG. 14 shows the case where the flow rate of the source gas to be introduced into the chamber 112 in step S104 is increased. In either of FIGS. 13 and 14, on the upper surface of the semiconductor wafer 1W, the film thickness of the metal oxide film 2 is thicker in the area 142 on a side near a gas inflow direction than that in other areas. Therefore, it is found that the film-thickness distribution of the metal oxide film 2 on the semiconductor wafer 1W becomes uneven in the step of the comparative example irrespectively of the flow rate of the source gas to be introduced into the chamber 112 in step S104.

The inventors has studied causes for this unevenness of the film thickness of the metal oxide film 2 and found out the following.

A first cause is condensation of the source gas introduced into the chamber. In the process of the comparative example, the mixed gas of the source gas and the inert gas is introduced into the chamber 112 in step S104. In this case, the mixed gas of the source gas and the inert gas is introduced into the chamber 112 in a low-pressure state (for example, on the order of 13.3 Pa (0.1 Torr)). If the pressure of the chamber 112 at the time of introduction of the mixed gas is low, the temperature of the mixed gas is decreased due to adiabatic expansion when the mixed gas of the source gas and the inert gas enters the chamber 112 in step S104, and thus the source gas contained in the mixed gas tends to be condensed. A portion of the semiconductor wafer 1W which the source gas introduced into the chamber 112 first makes contact with is on a side (area 142 surrounded by the dotted line in FIGS. 13 and 14) near the gas inlet (connecting portion of the gas path 118 and the chamber 112). The source gas is condensed at that portion, and the film thickness of the metal oxide film 2 to be formed tends to be thick there. This makes the film-thickness distribution of the metal oxide film 2 on the semiconductor wafer 1W uneven.

A second cause is an influence of a flow of the source gas introduced into the chamber. In the process of the comparative example, the gas in the chamber 112 is always exhausted from the gas exhaust outlet 114 in steps S101 through S106. Therefore, when the mixed gas of the source gas and the inert gas is introduced in step S104 from the gas path 118 into the chamber 112, the source gas (source gas contained in the mixed gas) introduced into the chamber 112 flows linearly in one direction (a direction along the direction 141) toward the gas exhaust outlet 114. In other words, in step S104, the source gas flows linearly in one direction (direction along the direction 141) from the gas inlet (connecting portion between the gas path 118 and the chamber 112) toward the gas exhaust outlet 114 in the chamber 112, and thus a turbulence-like gas flow is difficult to make, and the source gas is difficult to be diffused over the chamber 112. Therefore, the source gas molecules are absorbed on the surface of the semiconductor wafer 1W in a distribution along the flow of the gas, thereby causing the film-thickness distribution of the metal oxide film 2 on the semiconductor wafer 1W to become uneven.

By contrast, in the present embodiment, the mixed gas of the source gas for depositing the metal oxide film 2 and the inert gas is introduced into the chamber 12 set at the pressure $P_1$ of 133 Pa (1 Torr) or higher, more preferably, 667 Pa (5 Torr) or higher in step S4. With the pressure $P_1$ inside of the chamber 12 at the time of introduction of the mixed gas of the source gas and the inert gas being previously set relatively high at 133 Pa (1 Torr) or higher, more preferably, 667 Pa (5 Torr) or higher, a decrease in temperature of the mixed gas due to adiabatic expansion can be suppressed when the mixed gas 33 of the source gas and the inert gas enters the chamber 12 in step S4, thereby suppressing or preventing the occurrence of condensation of the source gas. In this manner, even if the source gas introduced into the chamber 12 makes contact with the semiconductor wafer 1W, the source gas does not become condensed. Thus, the molecules of the source gas are evenly absorbed onto the surface of the semiconductor wafer 1W, thereby eliminating the first cause and forming the metal oxide film 2 having an even film thickness on the semiconductor wafer 1W.

Furthermore, in the present embodiment, in steps S4, S5 of introducing the source gas into the chamber 12, the gate valve 15 is closed to prevent the gas in the chamber 12 from being exhausted to the outside of the chamber 12. In steps S4, S5, when the source gas is introduced into the chamber 12 without exhaust, the source gas (source gas contained in the mixed gas 33 and the gas 35) introduced into the chamber 12 can cause a turbulence-like flow in the chamber 12, and the source gas tends to be diffused easily over the chamber 12. Thus, the molecules of the source gas are evenly absorbed over the entire upper surface of the semiconductor wafer 1W, thereby eliminating the second cause and forming the metal oxide film 2 having an even film thickness.

Still further, if the pressure inside of the chamber 12 at the time of introduction of the mixed gas of the source gas and the inert gas is 1 atmospheric pressure (that is, 101325 Pa) or higher, introduction of the gas into the chamber 12 becomes difficult, and the structure for keeping hermeticity of the chamber 12 is complex. Therefore, it is required to set the pressure $P_1$ lower than 1 atmospheric pressure, that is, lower than 101325 Pa (760 Torr) (P1<101325 Pa). In this manner, the gas can be introduced into the chamber 12 in step S4. Still further, as the mixed gas 33 and the gas 35 being introduced into the chamber 12 in steps S4, S5, the pressure inside the chamber 12 becomes higher than the pressure $P_1$. Therefore, a pressure $P_2$ inside of the chamber 12 after the introduction of the mixed gas 33 and the gas 35 into the chamber 12 in steps S4, S5 is preferably lower than 1 atmospheric pressure, that is, lower than 101325 Pa (760 Torr). Thus, the pressure inside of the chamber 12 is prevented from becoming 1 atmospheric pressure (101325 Pa) or higher, thereby easily keeping the hermeticity of the chamber 12.

However, even with the pressure being lower than 1 atmospheric pressure (101325 Pa, 760 Torr), if the mixed gas 33 of the source gas and the inert gas is introduced into the chamber 12 in step S4 with the pressure $P_1$ inside of the chamber 12 being too high, the source gas does not go over to the inside of the chamber 12 and the gas is difficult to be mixed well in the chamber 12, thereby causing the introduced source gas to be present unevenly. This invites uneven absorption of the source gas molecules onto the surface of the semiconductor wafer 1W, thereby possibly causing an uneven film thickness of the metal oxide film 2 formed on the semiconductor wafer 1W. Therefore, in the present embodiment, the pressure $P_1$ inside of the chamber 12 at the time of introduction of the mixed gas of the source gas and the inert gas in step S4 is preferably set at 2666 Pa (20 Torr) or lower (that is, $P_1 \leqq 2666$ Pa), more preferably, 1333 Pa (10 Torr) or lower (that is, $P_1 \leq 1333$ Pa). By setting the pressure $P_1$ preferably at 2666 Pa (20 Torr) or lower, more preferably, 1333 Pa (10 Torr) or lower, the gas can be easily mixed inside of the chamber 12, thereby allowing the source gas to be evenly present in the chamber 12. Thus, the source gas molecules can be evenly absorbed onto the surface of the semiconductor wafer 1W, and the film-thickness distribution of the metal oxide film 2 formed on the semiconductor wafer 1W can be more even. Therefore, it is necessary for the pressure $P_1$ to be 133 Pa (1 Torr) or higher, and lower than 101325 Pa (1 atmospheric pressure, 760 Torr), but the pressure $P_1$ is preferably within a range of 133 to 2666 Pa (1 to 20 Torr) and, most preferably, within a range of 667 to 1333 mPa (5 to 10 Torr).

And, the pressure $P_2$, which is a pressure inside the chamber 12 after the mixed gas 33 and the gas 35 are introduced into the chamber 12 in steps S4, S5 and before the gas in the chamber 12 is exhausted to the outside of the chamber 12 in step S7, is preferably 5333 Pa (40 Torr) or lower (that is, $P_2 \leq 5333$ Pa) and, more preferably, 2666 Pa (20 Torr) or lower (that is, $P_2 \leq 2666$ Pa). In this manner, the gas can be further easily mixed in the chamber 12, and the source gas can be appropriately and evenly present in the chamber 12. Thus, the source gas molecules can be evenly absorbed onto the surface of the semiconductor wafer 1W, and the film-thickness distribution of the metal oxide film 2 formed on the semiconductor wafer 1W can be more adequately even.

Therefore, in the present embodiment, the source gas (source gas contained in the mixed gas 33 and the gas 35) is introduced in steps S4, S5 into the chamber 12 where an inert gas is introduced in advance to set the pressure at the pressure $P_1$ and no exhaust is performed. Then, this pressure $P_1$ is set to have a lower limit of 133 Pa (1 Torr) or higher, more preferably, 667 Pa (5 Torr) or higher, and an upper limit lower than 101325 Pa (1 atmospheric pressure, 760 Torr), preferably, 2666 Pa (20 Torr) or lower, and more preferably, 1333 Pa (10 Torr) or lower. In this manner, the metal oxide film 2 having an even film-thickness distribution can be formed on the main surface of the semiconductor wafer 1W. In the present embodiment of FIG. 15, it is found that an even film-thickness distribution of the metal oxide film 2 is achieved on the semiconductor wafer 1W compared with the comparative example of FIGS. 13 and 14 (in particular, the phenomenon of the increased film thickness in the area corresponding to the area 142 is suppressed).

Further, in the present embodiment, the pressure $P_1$ inside of the chamber 12 at the time of start of introduction of the mixed gas 33 of the source gas and the inert gas in step S4 is set in advance within the above-described range. Preferably, an inert gas is introduced into the chamber 12, and no gas other than the inert gas is substantially introduced. The mixed gas 33 of the source gas and the inert gas is introduced into the chamber 12 set to the pressure $P_1$ only by the inert gas in step S4, and thus the occurrence of condensation of the source gas entering inside of the chamber 12 can be suppressed or prevented, and also, the occurrence of unnecessary reaction due to an unnecessary gas can be prevented.

As described above, in the present embodiment, to prevent condensation of the source gas as it enters the inside of the chamber 12, the pressure inside the chamber 12 is made high in advance (the pressure is set at 133 Pa or higher, more preferably, 667 Pa or higher). Therefore, as compared with the case in which the pressure inside of the chamber 12 is decreased, the source gas introduced into the chamber 12 is difficult to go over to the whole inside of the chamber 12. Accordingly, more preferably in the present embodiment, introduction of the source gas into the chamber 12 is performed in steps S4, S5, and the flow rate of the gas (inert gas 34) fed from the gas path 18b to the gas path 18c in step S5 is set larger than the flow rate of the gas (mixed gas 33 of the inert gas and the source gas) fed from the gas path 18a to the gas path 18c in step S4.

More particularly, while the mixed gas 33 of the source gas and the inert gas is introduced into the chamber 12 in step S4, the gas that has not enter the chamber 12 but is left in the gas path 18c (mixed gas 33 of the source gas and the inert gas) is injected (pushed) into the chamber 12 with one push in step S5 in a short period of time by the inert gas fed from the gas path 18b. Thus, the flow rate of the gas (inert gas 34) fed from the gas path 18b to the gas path 18c in step S5 is set larger, thereby causing the gas left in the gas path 18c (mixed gas of the source gas and the inert gas) to be injected into the chamber 12 in one push in a short period of time in step S5. In this manner, the gas 35 is introduced into the chamber 12 in a puff shape. With the gas containing the source gas being injected into the chamber 12 in one push in a short period of time, the source gas can go over to the entire inside of the chamber 12 in step S5. Thus, the source gas can be more adequately prevented from being uneven in the chamber 12. Therefore, the source gas molecules can be more evenly absorbed onto the surface of the semiconductor wafer 1W, and the film thickness of the metal oxide film 2 formed on the semiconductor wafer 1W can be more even.

On the other hand, it is not preferable to increase the flow rate of the gas fed from the gas path 18a too much in view of stabilizing the amount of supply of the source gas from the deposition source chamber 22. Therefore, the flow rate of the gas (mixed gas 33 of the inert gas and the source gas) fed in step S4 from the gas path 18a to the gas path 18c is relatively decreased, whilst the flow rate of the gas (inert gas 34) fed in step S5 from the gas path 18b to the gas path 18c is relatively increased. More preferably, the flow rate of the gas (inert gas 34) fed in step S5 from the gas path 18b to the gas path 18c is double or more the flow rate of the gas (mixed gas 33 of the source gas and the inert gas) fed in step S4 from the gas path 18a to the gas path 18c, and more preferably, three times or more. For example, the flow rate of the gas (inert gas 34) fed in step S5 from the gas path 18b to the gas path 18c can be set on the order of 300 sccm, whilst the flow rate of the gas (mixed gas 33 of the inert gas and the source gas) fed in step S4 from the gas path 18a to the gas path 18c can be set on the order of 100 sccm. With the relation of the flow rates in step S4 and step S5 set as described above, the amount of supply of the source gas can be stabilized, and also the source gas in the chamber 12 can be equalized. Here, the flow rate of the gas (mixed gas 33 of the source gas and the inert gas) fed in step S4 from the gas path 18a to the gas path 18c substantially matches the flow rate of the inert gas 32 fed from the gas path 18a to the deposition source chamber 22.

While the source gas is introduced into the chamber 12 in both step S4 and step S5, it is preferable that the amount of the source gas (the number of moles) introduced into the chamber 12 in step S5 is larger than that in step S4. In this manner, the source gas molecules enter the inside of the chamber 12 more in step S5, where the gas is introduced into the chamber 12 with a higher flow rate than in step S4 where the gas is introduced into the chamber 12 with a low flow rate. Thus, the source gas molecules introduced into the chamber 12 can be more evenly diffused in the chamber 12. Thus, the source gas molecules can be further evenly absorbed onto the surface of the semiconductor wafer 1W, and the film thickness of the metal oxide film 2 formed on the semiconductor wafer 1W can be still more evenly.

Furthermore, in the present embodiment, after the source gas is introduced into the chamber 12 in steps S4, S5, the inside of the chamber 12 in step S6 is kept in a static atmosphere in which introduction and exhaust of the gas with respect to the chamber 12 is not performed and where the source gas is present for a predetermined time, and then the source gas in the chamber 12 is exhausted in step S7. By providing step S6, the source gas molecules can be sufficiently absorbed onto the surface of the semiconductor wafer 1W. Thus, the state can be achieved in which the source gas molecules are evenly absorbed onto the surface of the semiconductor wafer 1W.

Step S6 is performed preferably for on the order of one to ten seconds. If step S6 is too short, the absorption time of the source gas molecules onto the surface of the semiconductor wafer 1W may possibly be insufficient. If step S6 is too long, throughput may possibly be decreased. However, by performing step S6 for on the order of one to ten seconds, the source gas molecules can be sufficiently absorbed onto the surface of the semiconductor wafer 1W, thereby suppressing a decrease in throughput.

Furthermore, unevenness of the film-thickness distribution of the metal oxide film 2 due to the first and second causes described above come from the fact that the gas inside of the chamber 112 is always exhausted from the gas exhaust outlet 114 in steps S101 to S106 in the comparative example, and that the pressure inside of the chamber 112 is kept low. Therefore, in the present embodiment, instead of always exhausting the gas in the chamber 12 to the outside of the chamber 12 in steps S2 to S8, the gas in the chamber 12 is exhausted from the gas exhaust outlet 14 to the outside of the chamber 12 in steps S2, S7, S8, whilst the gate valve 15 is closed to prevent (the gas in) the chamber 12 from being exhausted in steps S3 to S6. In this manner, the pressure and gas in the chamber 12 can be appropriately controlled, and evenness of the film-thick distribution of the metal oxide film 2 can be adequately achieved.

Still further, as the metal oxide film 2, various metal oxides can be applied. Preferably, the metal oxide film 2 is made of a high-dielectric material with a relative permittivity (dielectric constant) higher than that of silicon oxide ($SiO_2$) (high-dielectric film, so-called high-k film). In the high-k film, the actual physical film thickness can be increased by multiplying [permittivity of the high-k film divided by the permittivity of the silicon oxide film] by itself, even with the same equivalent silicon oxide film thickness. Therefore, the high-k film is an extremely effective film in manufacturing semiconductor devices. Examples of the high-k material include hafnium oxide, aluminum oxide and rare-earth oxides.

The source gas for depositing hafnium oxide or rare-earth oxide has a relatively high vapor pressure, whilst the source gas for depositing rare-earth oxide tends to have a low vapor pressure. As the source gas has a lower vapor pressure, the source gas tends to condense more with a decrease in temperature due to adiabatic expansion when the source gas is introduced into the chamber 12 (that is, the first cause described above tends to occur more). In the present embodiment, condensation of the source gas at the time of introducing the source gas into the chamber 12 is suppressed or prevented to allow evenness of the film-thickness distribution. Therefore, applying the present embodiment to the case of using a source gas with a low vapor pressure is effective. Therefore, applying the present embodiment to the rare-earth oxide film as the metal oxide film 2 is effective.

Examples of possible source gases suitable for deposition of a hafnium (Hf) oxide film as the metal oxide film 2 include tetrakisdimethylaminohafnium (TDMAH: its chemical formula is $Hf[N(CH_3)_2]_4$). Also, examples of possible source gases suitable for deposition of an aluminum (Al) oxide film as the metal oxide film 2 include trimethylaluminum (TMA: its chemical formula is $Al(CH_3)_3$).

Also, examples of possible source gases suitable for deposition of a rare-earth oxide film as the metal oxide film 2 (possible source gases to be introduced into the chamber 12 in steps S4, S5) include a gas represented by a chemical formula of $Ln(RCp)_3$. In this chemical formula $Ln(RCp)_3$, Ln represents a rare-earth element, R represents an alkyl group (R: $C_nH_{2n+1}$), and Cp represents a cycropentadienyl group.

Figure 16:
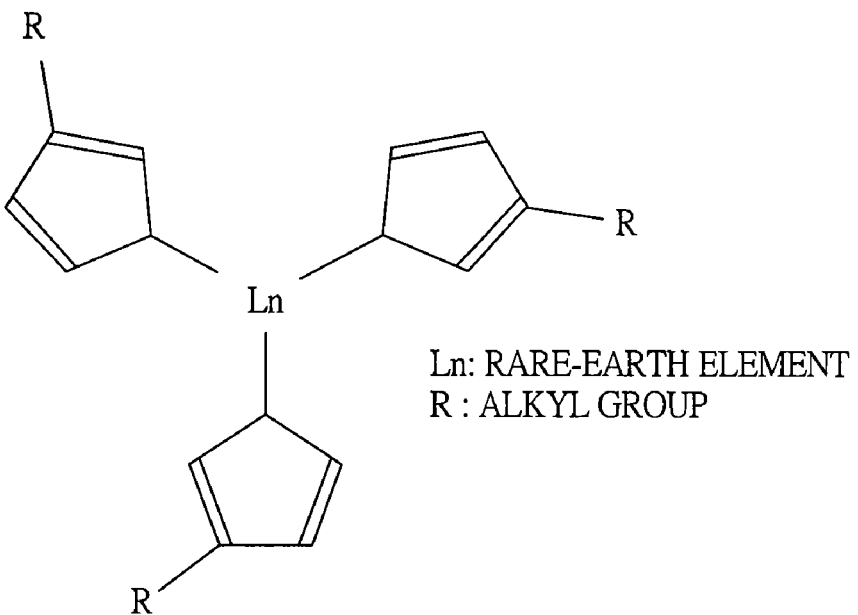
FIG. 16 is an illustrative diagram showing a chemical structural formula of $Ln(RCp)_3$.

FIG. 16 is an illustrative diagram showing a chemical structural formula of $Ln(RCp)_3$. In the structure of FIG. 16, a rare-earth element is placed at the position of Ln, and an alkyl group is placed at the position of R.

When an $Ln(RCp)_3$ gas is used as a source gas, an oxide of a rare-earth element structuring Ln in the chemical formula of $Ln(RCp)_3$ is deposited as the metal oxide film 2. Therefore, for example, if an yttrium oxide film is formed as the metal oxide film 2, the $Ln(RCp)_3$ gas is $Y(RCp)_3$ gas. If a lanthanum oxide film is formed as the metal oxide film 2, the $Ln(RCp)_3$ gas is a $La(RCp)_3$ gas.

For example, when lanthanum oxide is deposited as the metal oxide film 2, trisisopropylcyclopentadienyllanthanum (chemical formula: $La (i-C_3H_7C_5H_4)_3$) or trisethylcyclopentadienyllanthanum (chemical formula: $La (C_2H_5C_5H_4)_3$) can be used. Trisisopropylcyclopentadienyllanthanum (chemical formula: $La(i-C_3H_7C_5H_4)_3$) is formed by replacing Ln by La (lanthanum) and R by $i-C_3H_7$ in the chemical formula of $Ln(RCp)_3$. Trisethylcyclopentadienyllanthanum (chemical formula: $La(C_2H_5C_5H_4)_3$) is formed by replacing Ln by La (lanthanum) and R by $C_2H_5$ in the chemical formula of $Ln(RCp)_3$.

And, for example, when yttrium oxide is deposited as the metal oxide film 2, tris-n-butylcyclopentadienylyttrium (chemical formula: $Y (n-C_4H_9C_5H_4)_3$) or trismethylcycropentadienylyttrium (chemical formula: $Y(CH_3C_5H_4)_3$) can be used. Tris-n-butylcyclopentadienylyttrium (chemical formula: $Y(n-C_4H_9C_5H_4)_3$) is formed by replacing Ln by Y (yttrium) and R by $n-C_4H_9$ in the chemical formula of $Ln(RCp)_3$. Trismethylcycropentadienylyttrium (chemical formula: $Y(CH_3C_5H_4)_3$) is formed by replacing Ln by Y (yttrium) and R by $CH_3$ in the chemical formula of $Ln(RCp)_3$.

Note that, trisisopropylcyclopentadienyllanthanum (chemical formula: $La(i-C_3H_7C_5H_4)_3$) formed by replacing Ln by La and R by $i-C_3H_7$ in the chemical formula of $Ln(RCp)_3$ will be hereinafter abbreviated as $La(i-PrCp)_3$ for simplification. Therefore, in the chemical formula of $La(i-PrCp)_3$, Pr corresponds to $C_3H_7$, whilst Cp corresponds to a cyclopentadienyl group. And, trisethylcyclopentadienyllanthanum (chemical formula: $La(C_2H_5C_5H_4)_3$) formed by replacing Ln by La and R by $C_2H_5$ in the chemical formula of $Ln(RCp)_3$ will be hereinafter abbreviated as $La(EtCp)_3$ for simplification. Therefore, in the chemical formula of $La(EtCp)_3$, Et corresponds to $C_2H_5$, whilst Cp corresponds to a cyclopentadienyl group.

When a rare-earth oxide film is deposited as the metal oxide film 2, it is preferable to use the $Ln(RCp)_3$ gas mentioned above, which has a high thermostability and is resistant to alteration, is used as a source gas (rare-earth source gas), thereby making it possible to stably supply a high-quality source gas into the chamber 12 and prevent taking nitrogen into the formed film because the source gas does not contain nitrogen. However, $Ln(RCp)_3$ mentioned above has a drawback of a low vapor pressure, which tends to condense with a temperature decrease due to adiabatic expansion when the $Ln(RCp)_3$ gas is introduced into the chamber 12 (the first cause described above tends to occur). Conversely, if a gas with a high vapor pressure is selected in place of $Ln(RCp)_3$ mentioned above, such a gas has a drawback of a low thermostability and a tendency of alteration.

On the contrary, in the present embodiment, condensation of the source gas can be suppressed or prevented when the source gas is introduced into the chamber 12 as described above. Therefore, even when the $Ln(RCp)_3$ gas with a low vapor pressure is used, condensation of the $Ln(RCp)_3$ gas can be prevented when the $Ln(RCp)_3$ gas is introduced into the chamber 12. Accordingly, by applying the present embodiment to the case of using the $Ln(RCp)_3$ gas as the source gas, the advantages of using the $Ln(RCp)_3$ gas (ease of stable supply of a high-quality gas and prevention of intake of nitrogen into the film) and equalization of a film-thickness distribution by preventing condensation of the $Ln(RCp)_3$ gas when introducing the gas into the chamber 12 can be both achieved. Therefore, it is very effective to apply the present embodiment to the case where the $Ln(RCp)_3$ gas is used as the source gas (rare-earth source gas) to deposit a rare-earth oxide film as the metal oxide film 2.

When a lanthanum oxide film is deposited as the metal oxide film 2, among the $Ln(RCp)_3$ gases above, $La(i-PrCp)_3$ gas or the $La(EtCp)_3$ gas is preferably used as a La source gas, and more preferably, the $La(i-PrCp)_3$ gas is used. The $La(i-PrCp)_3$ gas or the $La(EtCp)_3$ gas, in particular, the $La(i-PrCp)_3$ gas, has excellent characteristics of a high thermostability and resistant to alteration, thereby facilitating stable supply of a high-quality source gas into the chamber 12. And, since the source gas does not contain nitrogen, nitrogen can be prevented from being taken in the formed film. However, among the $Ln(RCp)_3$ gases, $La(i-PrCp)_3$ gas and the $La(EtCp)_3$ gas, in particular, the $La(i-PrCp)_3$ gas has an extremely low vapor pressure, and has a high possibly of being condensed along with a decrease in temperature due to adiabatic expansion when the source gas is introduced into the chamber 12 (that is, the first cause described above tends to occur). Thus, it is very effective to use $La(i-PrCp)_3$ gas or $La(EtCp)_3$ gas, in particular, the $La(i-PrCp)_3$ gas as the source gas (rare-earth source gas) to apply the present embodiment when a lanthanum oxide film is deposited as the metal oxide film 2. By applying the present embodiment, a more even film-thickness distribution of the lanthanum oxide film by preventing condensation of the source gas introduced into the chamber 12 can be achieved.

Further, the second cause described above particularly tends to occur in a source gas having a low absorption rate onto the semiconductor wafer (that is, the source tends not to be absorbed onto the semiconductor wafer). When such a source gas having a low absorption rate is used, the distribution of the source gas molecules to be absorbed onto the upper surface of the semiconductor wafer 1W tends to be influenced by the route of the source gas flow in the chamber 12. The $Ln(RCp)_3$ gases tend to have a low absorption rate onto the semiconductor wafer 1W, and such a characteristic is particularly significant in $La(i-PrCp)_3$ gas. As described above, in the present embodiment, the source gas is introduced into the chamber 12 with the gas in the chamber 12 being prevented from not being exhausted to the outside of the chamber 12 in steps S4 and S5, thereby preventing the second cause. Thus, it is very effective to apply the present embodiment when the $Ln(RCp)_3$ gas is used as a source gas to deposit a rare-earth oxide film as the metal oxide film 2, particularly when $La(i-PrCp)_3$ gas is used as a source gas to deposit a lanthanum oxide film as the metal oxide film 2. By applying the present embodiment, the second cause can be prevented, thereby making the source gas molecules to be evenly absorbed onto the entire upper surface of the semiconductor wafer 1W, and forming the metal oxide film 2 with an even film-thickness on the semiconductor wafer 1W.

Still further, the $Ln(RCp)_3$ gas, in particular, the $La(i-PrCp)_3$ gas, has a low absorption rate to be absorbed onto the semiconductor wafer 1W. Therefore, when the $Ln(RCp)_3$ gas is used as a source gas to deposit a rare-earth oxide film as the metal oxide film 2, in particular, when the $La(i-PrCp)_3$ gas is used as a source gas to deposit a lanthanum oxide film as the metal oxide film 2, it is very effective to perform step S6 between steps S4, S5 and step S7. By providing step S6, even the molecules of the source gas (the $Ln(RCp)_3$ gas, in particular, the $La(i-PrCp)_3$ gas) having a low absorption rate can be sufficiently absorbed onto the surface of the semiconductor wafer 1W, thereby achieving a more even film-thickness distribution of the metal oxide film 2 formed on the semiconductor wafer 1W. And, by performing step S6 for one to ten seconds, absorption of the molecules of the source gas onto the surface of the semiconductor wafer 1W can be promoted. Also, it is possible to prevent an increase in time required for deposition that decreases throughput.

Figure 17:
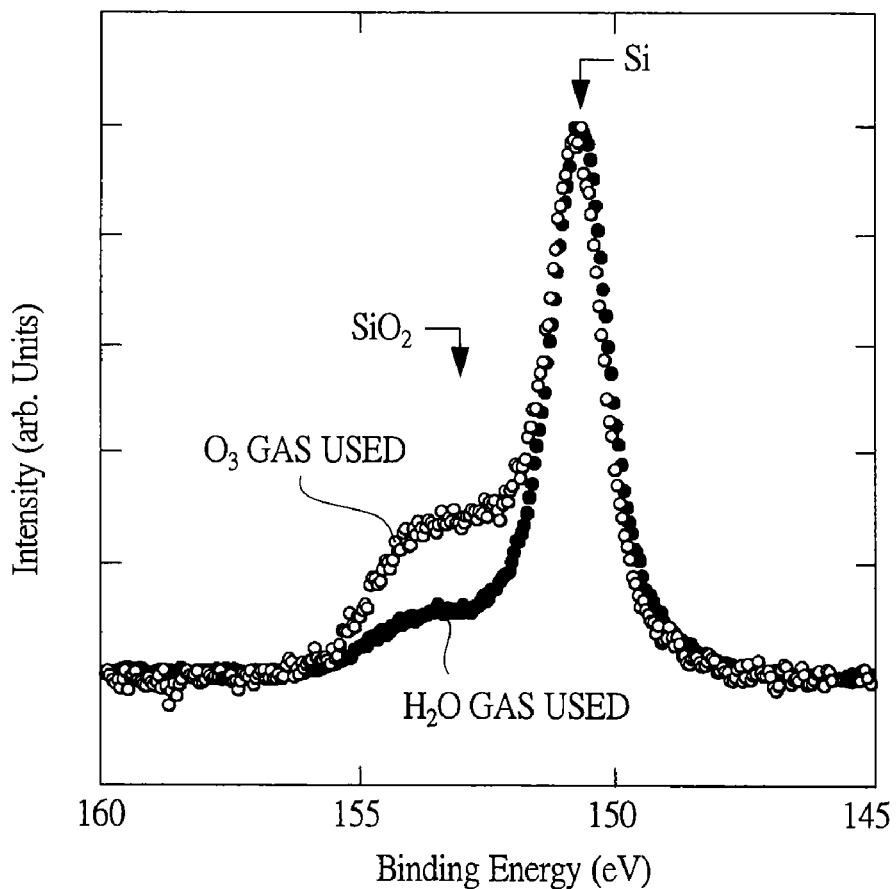
FIG. 17 is a graph showing a spectrum obtained by measuring the metal oxide film deposited on the semiconductor wafer by XPS.
Figure 18:
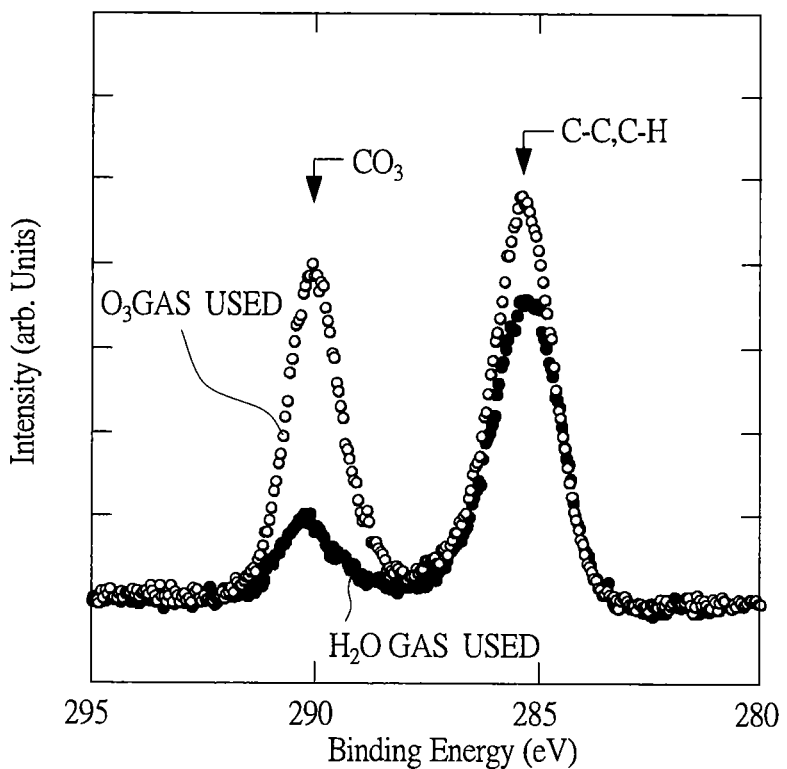
FIG. 18 is a graph showing a spectrum obtained by measuring the metal oxide film deposited on the semiconductor wafer by XPS.
Figure 19:
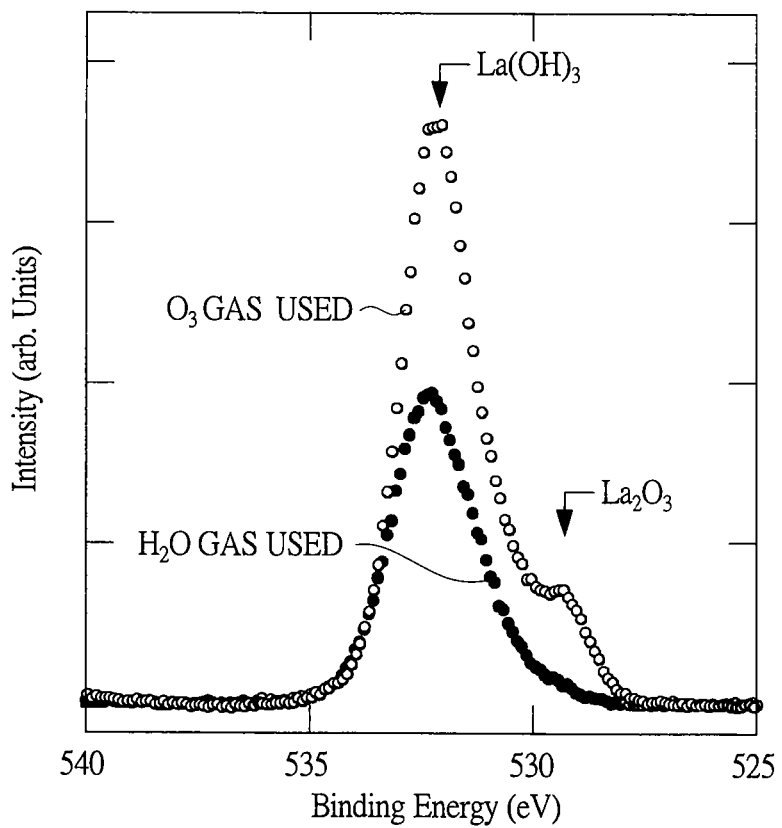
FIG. 19 is a graph showing a spectrum obtained by measuring the metal oxide film deposited on the semiconductor wafer by XPS.

FIGS. 17 to 19 are graphs (illustrative diagrams) each showing a spectrum obtained by measuring the metal oxide film 2 deposited on the semiconductor wafer 1W by XPS (X-ray Photoelectron spectroscopy) method. In the graphs of FIGS. 17 to 19, the horizontal axis represents energy (binding energy), whilst the vertical axis therein represents intensity of the spectrum (in arbitrary units). FIGS. 17 to 19 represent spectra of different energy ranges of the same test sample. Here, in FIGS. 17 to 19, the $La(i-PrCp)_3$ gas is used as the source gas for depositing the metal oxide film 2 to deposit a lanthanum oxide film as the metal oxide film 2. These diagrams also show XPS measurement results for two test samples when $H_2O$ gas is used as the oxidation gas 36 (represented by black circles in the graphs of FIGS. 17 to 19) and when $O_3$ gas (ozone) is used as the oxidation gas 36 (represented by white circles in the graphs of FIGS. 17 to 19).

In the graph of FIG. 17, a large peak shown near 151 eV represents a spectrum corresponding to Si of the semiconductor wafer 1W itself, whilst a shoulder portion occurring near 153 eV represents a spectrum corresponding to $SiO_2$. Therefore, this indicates that as the intensity of the shoulder-shaped spectrum occurring near 153 eV in the graph of FIG. 17 is higher, $SiO_2$ tends to be formed at an interface between the semiconductor wafer 1W and the metal oxide film 2. As evident from the graph of FIG. 17, the intensity of the spectrum corresponding to $SiO_2$ when the $H_2O$ gas is used as the oxidation gas 36 is lower than that when the $O_3$ gas is used as the oxidation gas 36, and therefore $SiO_2$ tends not to be formed at the interface between the semiconductor wafer 1W and the metal oxide film 2.

In the graph of FIG. 18, a peak shown near 285 eV represents a spectrum corresponding to C—C bonding or C—H bonding, whilst a peak occurring near 290 eV represents a spectrum corresponding to $CO_3$. As evident from the graph of FIG. 18, it is suggested that the intensity of the spectrum corresponding to $CO_3$ when the $H_2O$ gas is used as the oxidation gas 36 is lower than that when the $O_3$ gas is used as the oxidation gas 36, and therefore $CO_3$ tends not to be formed in the film.

Such tendency of suppression of formation of $SiO_2$ at the interface between the semiconductor wafer 1W and the metal oxide film 2 and formation of $CO_3$ in the metal oxide film 2 in the case of using the $H_2O$ gas rather than the case of using the $O_3$ gas as the oxidation gas 36 can be generally observed when the $Ln(RCp)_3$ gas is used as the source gas for depositing the metal oxide film 2, and this is particularly significant when the La(i-PrCp)$_3$ gas is used. A possible reason for more suppression of formation of SiO$_2$ at the interface between the semiconductor wafer 1W and the metal oxide film 2 and formation of CO$_3$ in the metal oxide film 2 in the case of using the H$_2$O gas rather than the case of using the O$_3$ gas as the oxidation gas 36 can be such that H$_2$O is weaker in oxidizing power than O$_3$, thereby preventing excessive oxidization.

Therefore, when the Ln(RCp)$_3$ gas is used as the source gas for depositing the metal oxide film 2, in particular, when the La(i-PrCp)$_3$ gas is used, the H$_2$O gas (water vapor gas) is more preferably used as the oxidation gas 36. In this manner, formation of SiO$_2$ at the interface between the semiconductor wafer 1W and the metal oxide film 2 can be suppressed or prevented, and also formation of CO$_3$ in the metal oxide film 2 can be suppressed or prevented.

In the graph of FIG. 19, a peak shown near 532 to 533 eV represents a spectrum corresponding to La(OH)$_3$, whilst a shoulder portion occurring near 529 to 530 eV represents a spectrum corresponding to La$_2$O$_3$. As evident from the graph of FIG. 19, in the formed metal oxide film 2, La(OH)$_3$ is more generated than La$_2$O$_3$. However, the ratio of generation of La$_2$O$_3$ when the H$_2$O gas is used is lower than that when the O$_3$ gas is used as the oxidation gas. A possible reason for this can be such that H$_2$O is weaker in oxidizing power than O$_3$ and therefore La$_2$O$_3$ tends not to be generated.

However, the main component of the film is required to be La$_2$O$_3$ instead of La(OH)$_3$. Therefore, a thermal treatment (annealing) is preferably performed.

Figure 20:
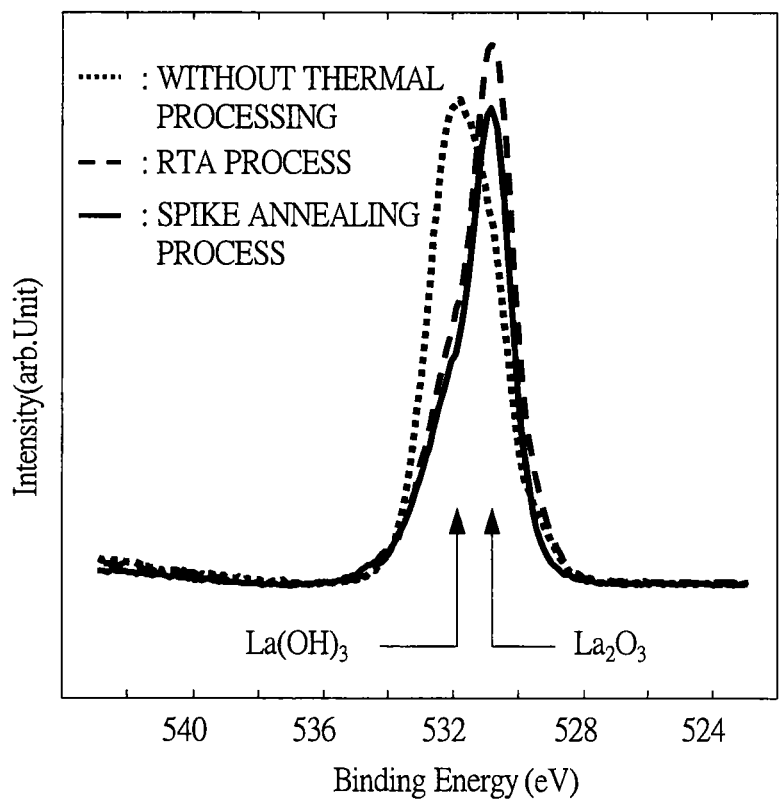
FIG. 20 is a graph showing a spectrum obtained by measuring the metal oxide film deposited on the semiconductor wafer by XPS.
Figure 21:
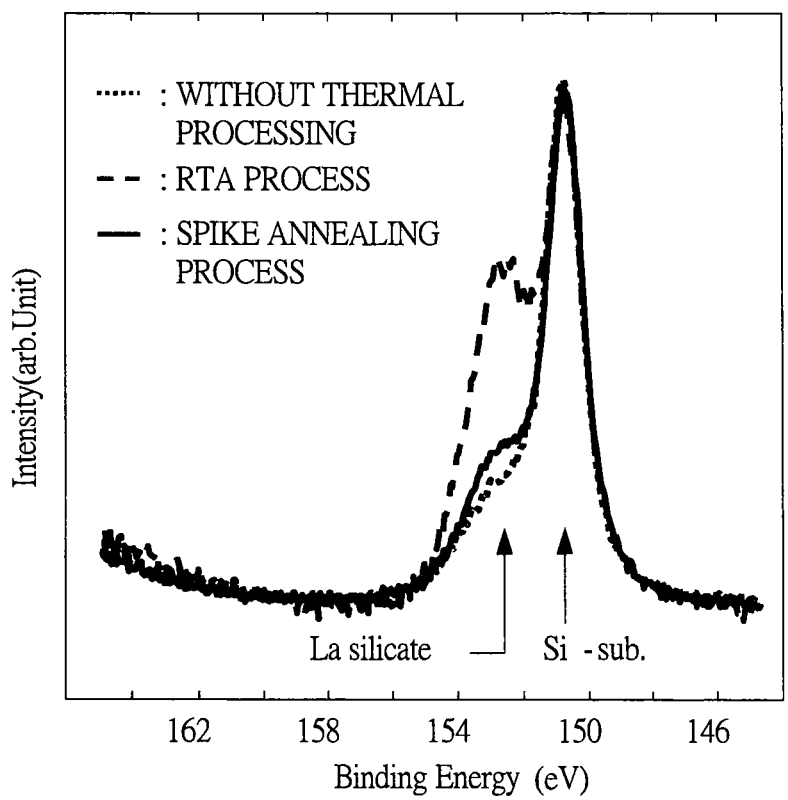
FIG. 21 is a graph showing a spectrum obtained by measuring the metal oxide film deposited on the semiconductor wafer by XPS.

FIGS. 20 and 21 are graphs (illustrative drawings) each showing a spectrum obtained by measuring the metal oxide film 2 deposited on the semiconductor wafer 1W by XPS method. In the graphs of FIGS. 20 and 21, the horizontal axis represents energy (binding energy), whilst the vertical axis therein represents intensity of the spectrum (in arbitrary units). FIGS. 20 and 21 show spectra of different energy ranges of the same test sample. Here, FIGS. 20 and 21 show XPS measurement results for three test samples when the La(i-PrCp)$_3$ gas is used as the source gas and an H$_2$O gas is used as the oxidation gas to deposit a lanthanum oxide film as the metal oxide film, with respect to three cases: one in which a thermal treatment is not performed after deposition; another in which an RTA (Rapid Thermal Annealing) process is performed after deposition; and the other in which a spike annealing (spike RTA) process is performed after deposition. In FIGS. 20 and 21, the performed RTA process and the spike annealing process are thermal treatments at 800° C. in nitrogen (N$_2$) gas atmosphere.

As shown in the graph of FIG. 20, when no thermal treatment is performed, the spectrum intensity corresponding to La(OH)$_3$ is higher than the spectrum intensity corresponding to La$_2$O$_3$. However, when an RTA process is performed after deposition and when a spike annealing process is performed after deposition, the spectrum intensity corresponding to La(OH)$_3$ is decreased, whilst the spectrum intensity corresponding to La$_2$O$_3$ is increased. This suggests that, when no thermal treatment is performed, there is more La(OH)$_3$ than La$_2$O$_3$ in the formed metal oxide film 2, but, when an RTA process is performed and when a spike annealing process is performed, La$_2$O$_3$ becomes the main component of the metal oxide film 2.

Therefore, by performing a thermal treatment, such as an RTA process or a spike annealing process, the metal oxide film 2 can be made as a film with La$_2$O$_3$ as a main component.

Also, in the graph of FIG. 21, a large peak near 151 eV represents a spectrum corresponding to Si of the semiconductor wafer 1W itself. Furthermore, compared with the case where no thermal treatment is performed, in the case where an RTA process is performed and in the case where a spike annealing process is performed, the spectrum intensity is increased near 153 eV to form a shoulder portion or peak. A possible reason for this is such that the spectrum intensity of lanthanum silicate is increased. This suggests that, by performing a thermal treatment, such as an RTA process or a spike annealing process, the metal oxide film 2 and the semiconductor wafer 1W react with each other to form lanthanum silicate.

However, as evident from the graph of FIG. 21, the spectrum intensity corresponding to lanthanum silicate can be more decreased when a spike annealing process is performed than when an RTA process is performed. That is, compared with the case of performing an RTA process, it is possible to further suppress formation of lanthanum silicate between the metal oxide film 2 and the semiconductor wafer 1W reacting with each other in the case of performing a spike annealing process.

Therefore, a spike annealing process (spike RTA) is more preferably performed as the thermal treatment. In this manner, it is possible to suppress or prevent the reaction between the metal oxide film 2 and the semiconductor wafer 1W due to thermal treatment, thereby suppressing or preventing generation of unnecessary products at the interface between the metal oxide film 2 and the semiconductor wafer 1W.

Figure 22:
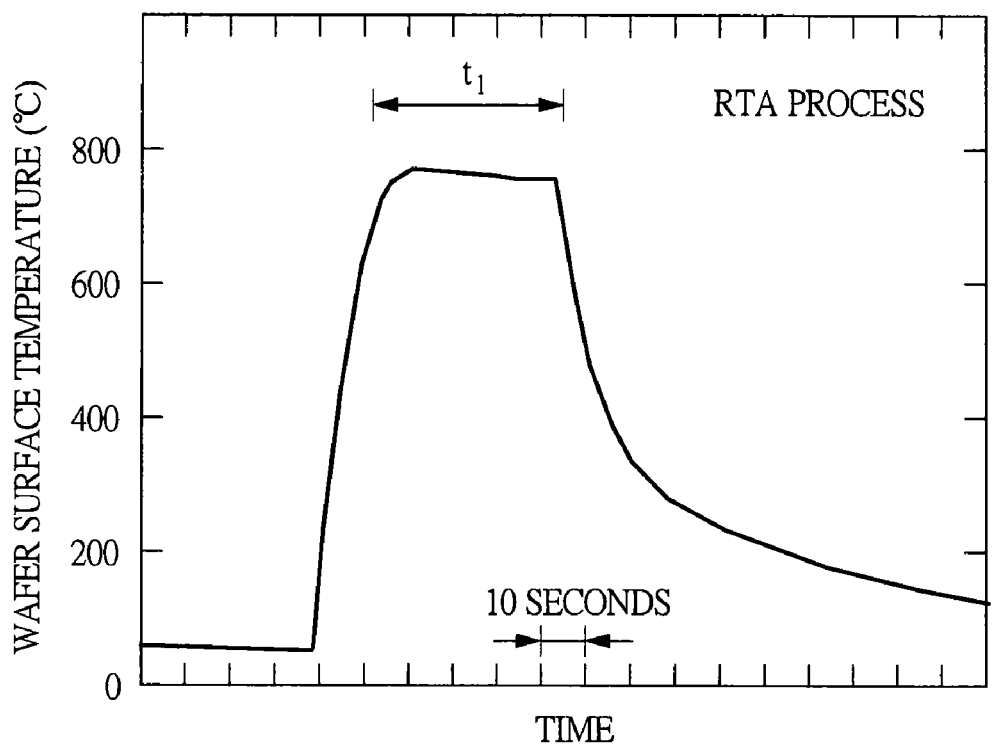
FIG. 22 is a graph showing an example of a surface temperature of the semiconductor wafer in RTA processing.
Figure 23:
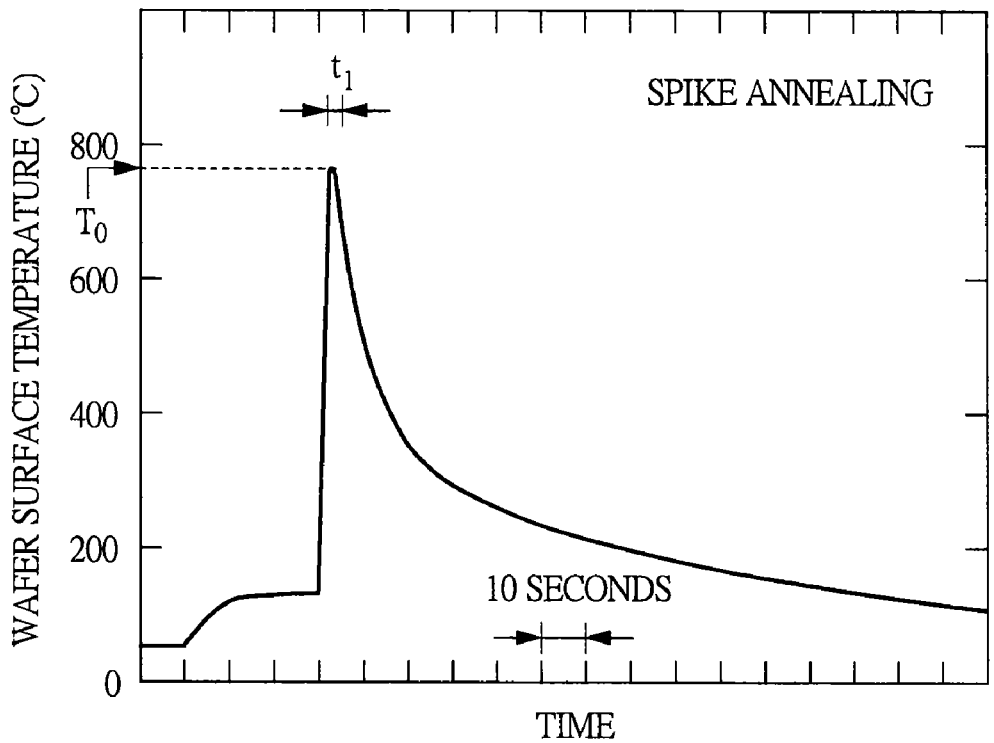
FIG. 23 is a graph showing an example of a surface temperature of the semiconductor wafer in a spike annealing process.

FIG. 22 is a graph showing an example of a surface temperature of the semiconductor wafer 1W in an RTA process. FIG. 23 is graph showing an example of a surface temperature of the semiconductor wafer 1W in a spike annealing process. In the graphs of FIGS. 22 and 23, the horizontal axis represents time, whilst the vertical axis represents surface temperature of the semiconductor wafer 1W.

As shown in FIGS. 22 and 23, the spike annealing process (FIG. 23) has a faster temperature rise/fall speed than that of the general RTA process (FIG. 22), and therefore is a short-time thermal treatment. The maximum temperature (maximum achieving temperature) of the semiconductor wafer 1W during the thermal treatment corresponds to a thermal treatment temperature "To". In the cases of FIGS. 22 and 23, the thermal treatment temperature To is approximately 780° C.

In the present application, a thermal treatment in which a time $t_1$ during which the surface of the semiconductor wafer 1W has a high temperature ("high temperature" herein means a temperature of 0.9 To° C. or higher, with the thermal treatment temperature being taken as To° C.; for example, when the thermal treatment temperature To is 800° C., 720° C. or higher) is about five seconds or shorter (that is, $t1 \leq$ five seconds) is referred to as spike annealing (spike RTA).

By performing the spike annealing (spike RTA) as the thermal treatment, where the time $t_1$ during which the semiconductor wafer 1W has a high temperature is short, the main component in the metal oxide film 2 can be changed into a desired metal oxide (for example, La$_2$O$_3$). Also, it is possible to prevent an unnecessary reaction between the metal oxide film 2 and the semiconductor wafer 1W due to the thermal treatment.

Next, timing of performing such a thermal treatment will be described.

As described above, by taking steps S2 to S8 as one cycle and performing a plurality of cycles, a metal oxide film is formed (deposited) by one atomic layer or the like on the semiconductor wafer 1W, thereby forming the metal oxide film 2 having a desired film thickness on the semiconductor wafer 1W. Although the thermal treatment can be performed after the metal oxide film 2 is deposited to have the desired film thickness, it is more preferable to perform a thermal treatment during the cycles of the steps S2 to S8.

Figure 25:
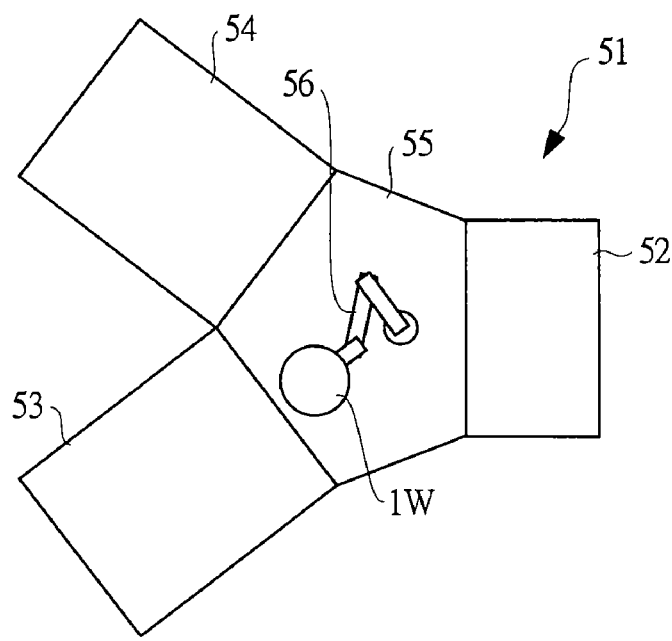
FIG. 25 is an illustrative diagram showing a conceptual structure of a semiconductor manufacturing apparatus for use in the process of FIG. 24.

FIG. 24 shows a manufacturing process flow chart of a process of forming the metal oxide film 2 on the semiconductor wafer 1W according to another embodiment of the present invention, and corresponds to the case where the thermal treatment is performed during the cycles of steps S2 to S8. FIG. 25 is an illustrative diagram (schematic cross-sectional view) showing a conceptual structure of a semiconductor manufacturing apparatus 51 for use in the process of FIG. 24.

The semiconductor manufacturing apparatus 51 shown in FIG. 25 includes: a load-lock chamber 52; an ALD module (deposition module, film-deposition apparatus, deposition chamber) 53; an annealing module (thermal treatment module, thermal treatment device, thermal treatment chamber) 54; and a transfer chamber 55 provided between them. A carrier device 56 is provided to the transfer chamber 55. The carrier device 56 is configured to move the semiconductor wafer 1W among the load-lock chamber 52, the ALD module 53, and the annealing module 54. The ALD module 53 is a module (apparatus) for depositing the metal oxide film 2 on the main surface of the semiconductor wafer 1W. The annealing module 54 is a module (apparatus) for performing a thermal treatment on the semiconductor wafer 1W. The load-lock chamber 52, the ALD module 53, the annealing module 54, and the transfer chamber 55 can be vacuum-airtight. Therefore, after the semiconductor wafer 1W is introduced in the load-lock chamber 52, a deposition process at the ALD module 53, a thermal treatment at the annealing module 54, and a process of moving the semiconductor wafer 1W by the carrier device 56 can be performed without exposing the semiconductor wafer 1W to air.

Next, the process of forming the metal oxide film 2 on the semiconductor wafer 1W by using the semiconductor manufacturing apparatus 51 will be concretely described.

First, the semiconductor wafer 1W on which the metal oxide film 2 is deposited is introduced into the load-lock chamber 52 of the semiconductor manufacturing apparatus 51.

Next, the semiconductor wafer 1W is moved to the ALD module (step S11). From the load-lock chamber 52 to the ALD module 53, the semiconductor wafer 1W can be moved via the carrier device 56 of the transfer chamber 55. The ALD module 53 has a structure substantially similar to that of the film-deposition apparatus 11. The semiconductor wafer 1W moved to the ALD module 53 in step S11 is then disposed in the chamber 12 (on the wafer stage 13).

Next, in the ALD module 53, one or more cycles of steps S2 to S8 are performed (step S12). In this manner, the metal oxide film 2 having a thickness according to the number of cycles performed is formed on the semiconductor wafer 1W.

Next, the semiconductor wafer 1W is moved to the annealing module 54 (step S13). From the ALD module 53 to the annealing module 54, the semiconductor wafer 1W can be moved via the carrier device 56 of the transfer chamber 55.

Next, in the annealing module 54, the semiconductor wafer 1W is subjected to thermal treatment (step S14). The film formed on the semiconductor wafer 1W in step S12 (metal oxide film 2) is subjected to thermal treatment in step S14 to form a film whose main component is a desired metal oxide (for example, $La_2O_3$ if a lanthanum oxide film is formed as the metal oxide film 2). For example, a metal hydroxide (for example, $La(OH)_3$) contained in the film (metal oxide film 2) formed on the semiconductor wafer 1W in step S12 can be changed into a metal oxide (for example, $La_2O_3$) through the thermal treatment in step S14. The thermal treatment in step S14 is preferably a spike annealing process, as described above. In this manner, the main component of the metal oxide film 2 can be changed into a desired metal oxide. Also, unnecessary reaction between the metal oxide film 2 and the semiconductor wafer 1W due to thermal treatment can be prevented, and further, the thermal treatment temperature (thermal treatment temperature To) in step S14 is more preferable to be 700 to 900° C. In this manner, the main component of the metal oxide film 2 can be adequately changed into a desired metal oxide. Also, unnecessary reaction between the metal oxide film 2 and the semiconductor wafer 1W due to thermal treatment can be adequately prevented. Still further, while the thermal treatment in step S12 can be performed in nitrogen ($N_2$) gas, it can be also performed in another inert gas, for example, argon (Ar) gas or helium (He) gas.

Then, the cycle of steps S11 to S14 is repeated until the metal oxide film 2 formed on the semiconductor wafer 1W has a desired film thickness.

That is, after the thermal treatment in step S14 is performed, the semiconductor wafer 1W is moved to the ALD module 53 as the next cycle of step S11, and then, as step S12, one or more cycles of steps S2 to S8 are performed in the ALD module 53. As step S13, the semiconductor wafer 1W is moved to the annealing module 54. As step S14, the semiconductor wafer 1W is subjected to thermal treatment. At this stage, if the metal oxide film 2 on the semiconductor wafer 1W does not have a desired film thickness, steps S11 to S14 of the next cycle are performed after this thermal treatment. This is repeated until the metal oxide film 2 on the semiconductor wafer 1W has a desired film thickness. In this manner, the metal oxide film 2 having a desired film thickness can be formed on the semiconductor wafer 1W.

After the cycle of steps S11 to S14 is repeated until the metal oxide film 2 formed on the semiconductor wafer 1W has a desired film thickness, the semiconductor wafer 1W is moved via the carrier device 56 of the transfer chamber 55 to the load-lock chamber 52, and the semiconductor wafer 1W is then sent from the load-lock chamber 52 to the next step.

Figure 26:
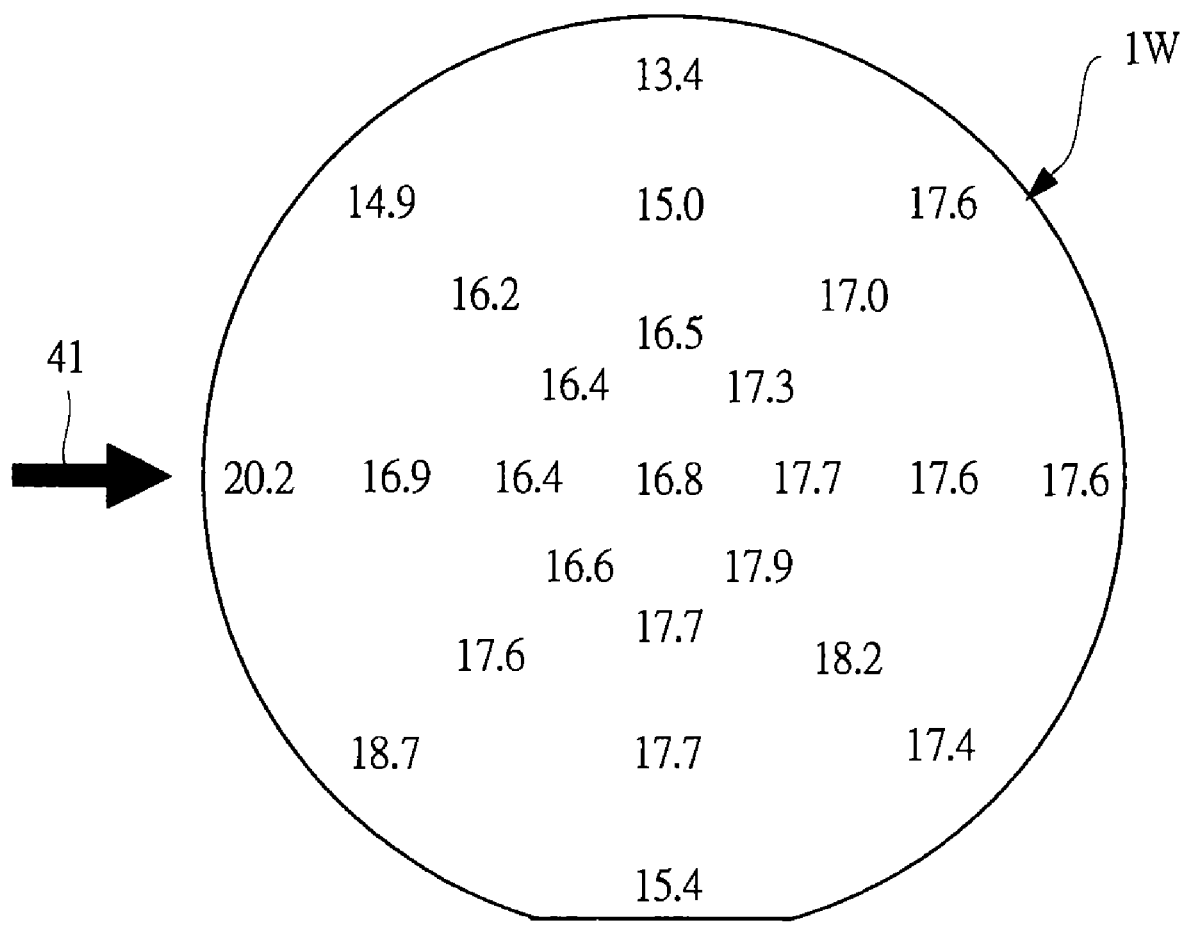
FIG. 26 is a drawing for describing a film-thickness distribution of the metal oxide film formed through the process of forming a metal oxide film on the semiconductor wafer according to the embodiment of the present invention.

FIG. 26 is an illustrative diagram (plan view) showing a film-thickness distribution of the metal oxide film 2 on the semiconductor wafer 1W when the metal oxide film 2 is deposited on the semiconductor wafer 1W in the manner as shown in FIG. 24, and corresponding to FIGS. 13 to 15. FIG. 26 shows an upper surface (a surface on which the metal oxide film 2 is formed) of the semiconductor wafer 1W, and each number written therein corresponds to a film thickness of the metal oxide film 2 formed at that position in an angstrom unit. Here, as with FIGS. 13 to 15, also in the case of FIG. 26, $La(i-PrCp)_3$ gas described above is used as the source gas for depositing the metal oxide film 2, and the film-thickness distribution in depositing a lanthanum oxide film as the metal oxide film 2 is shown. Note that, in FIG. 15, the metal oxide film 2 is deposited by performing twenty cycles of steps S2 to S8, but no thermal treatment is performed during the cycles, and a thermal treatment is performed after depositing the film up to the final film thickness. By contrast, in FIG. 26, a spike annealing process is performed after every three cycles of steps S2 to S8, and this is repeated six times to deposit the metal oxide film 2. In other words, in the case of FIG. 26, the metal oxide film 2 is deposited by performing three cycles of steps S2 to S8 in step S12 and steps S11 to S14 are performed six times.

Compared with FIG. 15, in FIG. 26, evenness of the film thickness of the metal oxide film 2 formed on the semiconductor wafer 1W is further improved. The reason for this may be the following.

That is, if a layer having a hydroxide (for example, $La(OH)_3$) as its main component is formed on the semiconductor wafer 1W, source gas molecules are difficult to be absorbed onto this layer. Therefore, there is a possibility that the absorbed source gas molecules may be uneven in the surface of the semiconductor wafer 1W. On the other hand, if a layer having an oxide (for example, $La_2O_3$) as its main component is formed on the semiconductor wafer 1W, source gas molecules are easily absorbed onto this layer. Therefore, the absorbed source gas molecules tend to be even (single layer) in the surface of the semiconductor wafer 1W. For this reason, by changing the layer formed on the semiconductor wafer 1W in step S12 (layer having $La(OH)_3$ as the main component) into a layer having a metal oxide ($La_2O_3$) as the main component through a thermal treatment in step 14, the distribution of the source gas molecules absorbed thereto can be more even, thereby making the film-thickness distribution of the formed metal oxide film 2 more even.

Therefore, a thermal treatment is more preferably performed during the cycles of steps S2 to S8 as shown in FIG. 24, compared to the case of performing the thermal treatment after the metal oxide film 2 is deposited up to the final film thickness (a stage where no more metal oxide film 2 is deposited). In this manner, the film-thickness distribution of the metal oxide film 2 on the main surface of the semiconductor wafer 1W can be more even.

Also, in view of equalization of the film-thickness distribution of the metal oxide film 2 on the main surface of the semiconductor wafer 1W, even other thermal treatment in step S14 than spike annealing (for example, even a general RTA process) is effective. As described above, however, in view of the capability of preventing an unnecessary reaction between the metal oxide film 2 and the semiconductor wafer 1W due to thermal treatment, the thermal treatment in step S14 is preferable to be spike annealing.

Further, it is a general tendency that a film having a hydroxide as the main component is formed at the stage immediately after deposition (before thermal treatment) in the case where the $Ln(RCp)_3$ gas is used as the source gas for depositing the metal oxide film 2, which is particularly significant when the $La(i-PrCp)_3$ gas is used. This can be attributed to low hydrolysis of the $Ln(RCp)_3$ gas, in particular, the $La(i-PrCp)_3$ gas. Therefore, when the $Ln(RCp)_3$ gas is used as the source gas for depositing the metal oxide film 2, in particular, when the $La(i-PrCp)_3$ gas is used, it is quite effective to deposit the metal oxide film 2 in the manner as shown in FIG. 24. In this manner, the film-thickness distribution of the metal oxide film 2 formed on the semiconductor wafer 1W can be more even.

Still further, the cycles of steps S2 to S8 performed in step S12 are required to be performed one or more times, and not one but two or more cycles are more preferable. In this manner, the time required for obtaining the desired film thickness of the metal oxide film 2 can be shortened, thereby improving throughput of the semiconductor device.

Moreover, if the number of cycles of steps S2 to S8 to be performed in step S12 is too many when the cycle of steps S2 to S8 is repeated in step S12, the source gas molecules are gradually becoming difficult to be absorbed, thereby causing the source gas molecules to be absorbed unevenly onto the semiconductor wafer 1W, and decreasing the effect of equalization of the film-thickness distribution of the metal oxide film 2. Therefore, the number of cycles of steps S2 to S8 to be performed in step S12 is preferably four or smaller. In this manner, the thermal treatment in step S14 is performed before absorption defect of the source gas molecules occurs in step S12, thereby more appropriately achieving the effect of equalizing the film-thickness distribution of the metal oxide film 2.

Next, an example of applying the method of depositing the metal oxide film 2 described above to a semiconductor device manufacturing process will be described.

FIGS. 27 to 32 are cross-sectional views of main parts during a process of manufacturing a semiconductor device a semiconductor device according to one embodiment of the present invention, for example, a semiconductor device comprising a MISFET (Metal Insulator Semiconductor Field Effect Transistor).

Figure 27:
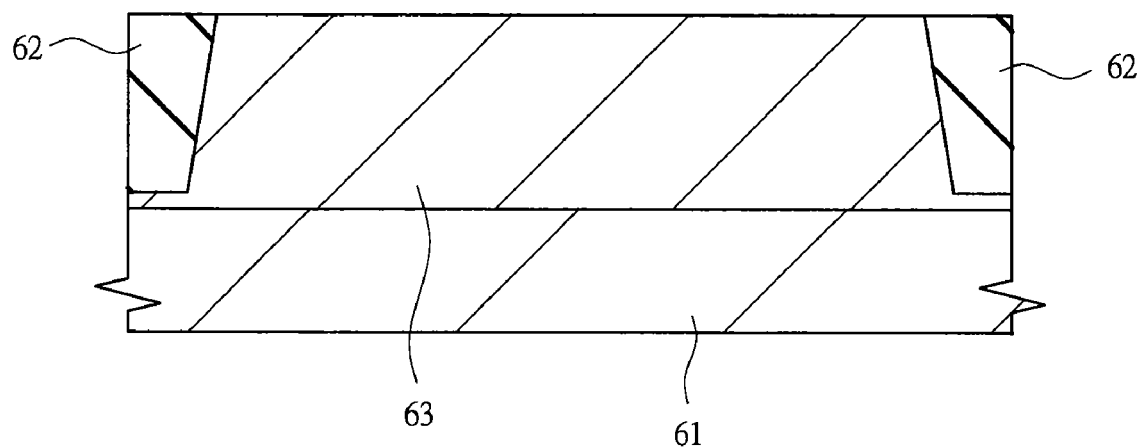
FIG. 27 is a cross-sectional view of main parts showing a semiconductor device during a manufacturing step according to one embodiment of the present invention.

First, as shown in FIG. 27, a semiconductor substrate (semiconductor wafer) 61 made of p-type single-crystal silicon having a specific resistance on the order of 1 to 10 Ωcm, for example, is provided. The semiconductor substrate 61 corresponds to the semiconductor wafer 1W described above.

Next, an isolation region 62 is formed on the main surface of the semiconductor substrate 61. The isolation region 62 is made of silicon oxide, and can be formed through STI (Shallow Trench Isolation) or LOCOS (Local Oxidization of Silicon), for example.

Next, a p-type well 63 is formed in a region of the semiconductor substrate 61 where an n-channel type MISFET to be formed. The p-type well 63 can be formed by ion-implanting p-type impurities, for example, boron (B), into the semiconductor substrate 61.

Figure 28:
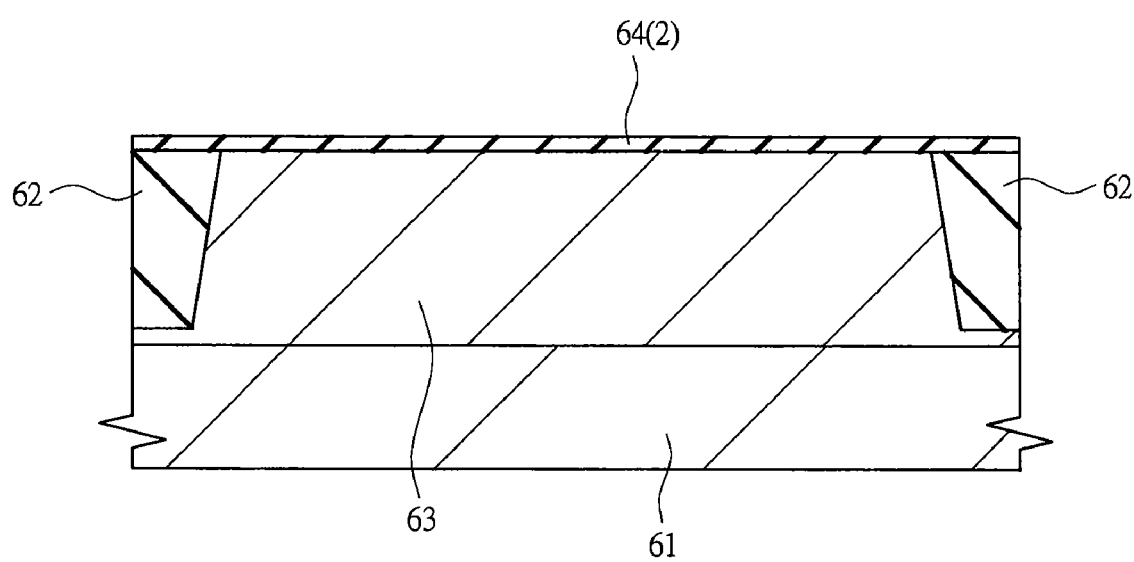
FIG. 28 is a cross-sectional view of main parts showing the semiconductor device in a manufacturing step continued from FIG. 27.

Next, as shown in FIG. 28, a metal oxide film 64 is formed on the main surface of the semiconductor substrate 61. This metal oxide film 64 is for a gate insulating film. The metal oxide film 64 has a relative permittivity higher than that of a silicon oxide ($SiO_2$) film, and is a so-called high-k film (high dielectric film). With the metal oxide film 64 as a high-k film used as a gate insulating film, leakage current at when the MISFET is ON can be reduced. The metal oxide film 64 corresponds to the metal oxide film 2 described above. The metal oxide film 64 is formed according to the process of forming the metal oxide film 2 on the semiconductor wafer 1W.

Figure 29:
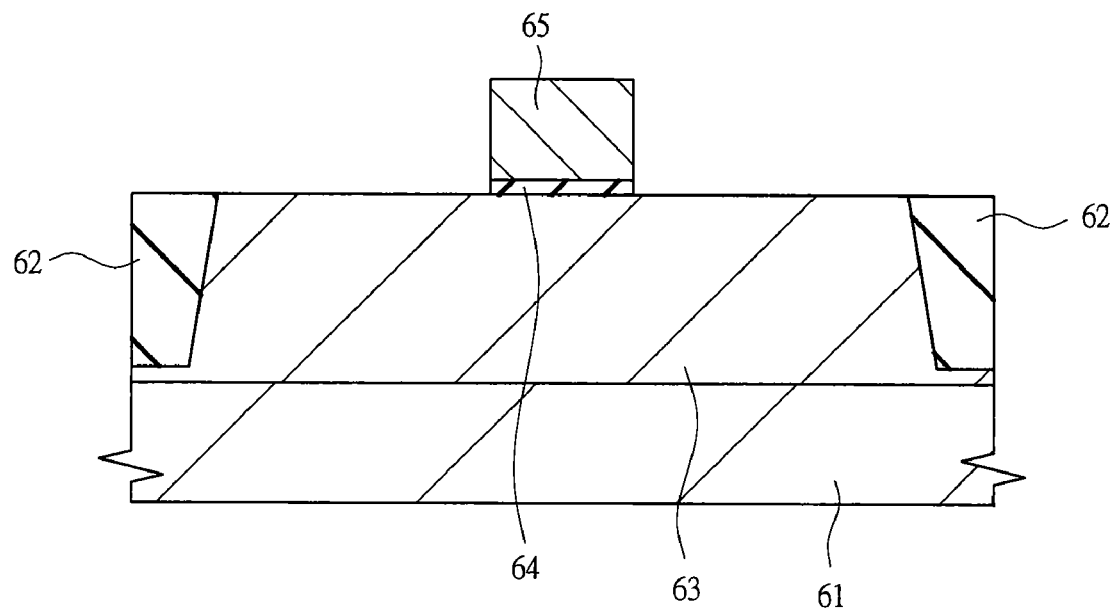
FIG. 29 is a cross-sectional view of main parts showing the semiconductor device in a manufacturing step continued from FIG. 28.

Next, as shown in FIG. 29, a gate electrode 65 is formed on the metal oxide film 64 of the p-type well 63. For example, the gate electrode 65 formed of a polycrystalline silicon film can be formed by forming a polycrystalline silicon film (or an amorphous film) on the semiconductor substrate 61, and ion-implanting n-type impurities, for example, phosphor (P), into that polycrystalline silicon film to form a low-resistance n-type semiconductor film, and then patterning the polycrystalline silicon film through dry etching. The metal oxide film 64 under the gate electrode 65 serves as a gate insulating film. And, the gate electrode 65 can be formed of a conductive film showing metal conductivity to be a so-called metal gate electrode. Furthermore, the gate electrode 65 can be formed by forming a multilayered film of a conductive film (conductive film for gate electrode) and an insulating film (insulating film for cap insulating film) on the semiconductor substrate 61, and then processing this multilayered film through dry etching. In this case, the structure is such that the insulating film (cap insulating film) is formed on the gate electrode 65. Still further, FIG. 29 shows the case where, at the time of dry etching for processing the gate electrode 65, an area of the metal oxide film 64 positioned under the gate electrode 65 is left, but an area of the metal oxide film 64 not covered with the gate electrode 65 is removed. Meanwhile, not only the area of the metal oxide film 64 covered with the gate electrode 65 but also the area of the metal oxide film 64 not covered with the gate electrode 65 can be left.

Figure 30:
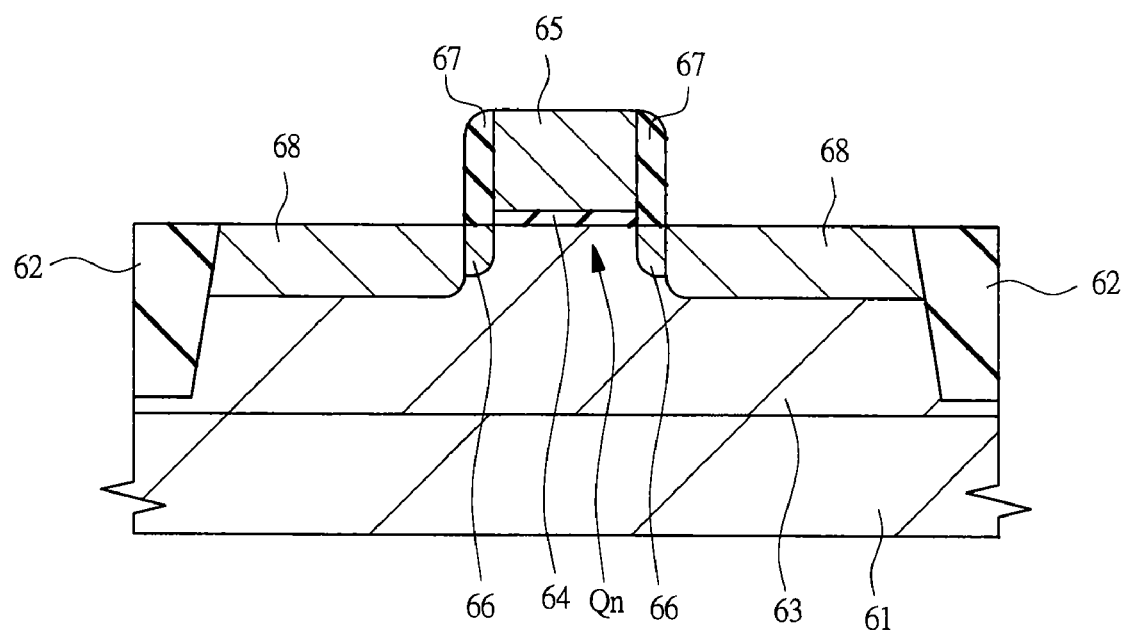
FIG. 30 is a cross-sectional view of main parts showing the semiconductor device in a manufacturing step continued from FIG. 29.

Next, as shown in FIG. 30, n-type impurities, such as phosphor (P) or arsenic (As), are ion-implanted to areas on both sides of the gate electrode 65 of the p-type well 63, thereby forming (a pair of) n⁻-type semiconductor regions 66.

Next, side-wall spacers or side walls (side-wall insulating films) 67 are formed of insulating films and formed on side walls of the gate electrode 65. The side walls 67 can be formed by, for example, depositing a silicon oxide film, a silicon nitride film, or a multilayered film thereof on the semiconductor substrate 61 and then performing anisotropic etching on that silicon oxide film, silicon nitride film, or multilayered film of them through RIE (Reactive Ion Etching).

After forming the side walls 67, (a pair of) n⁺-type semiconductor regions 68 (source, drain) are formed by, for example, ion-implanting n-type impurities, such as phosphor (P) and arsenic (Ar), on areas on both sides of the gate electrode 65 of the p-type well 63 and the side walls 67.

The n⁺-type semiconductor regions 68 have a high impurity density than that of the n⁻-type semiconductor regions 66. In this manner, an n-type semiconductor region (impurity diffusion layer) functioning as source or drain of the n-channel type MISFET is formed by the n⁺-type semiconductor region (impurity diffusion layer) 68 and the n⁻-type semiconductor region impurity diffusion layer) 66. In this manner, an n-channel type MISFET (Metal Insulator Semiconductor Field Effect Transistor) Qn is formed on the p-type well 63. The source/drain regions of the n-channel-type MISFET Qn have an LDD (Lightly Doped Drain) structure.

Figure 31:
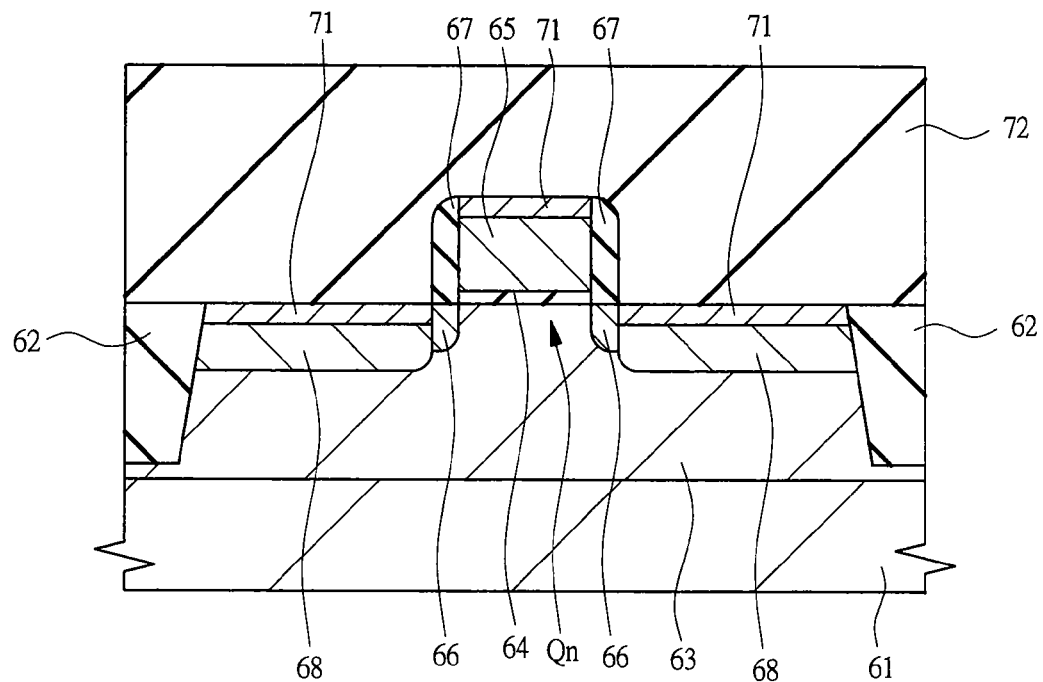
FIG. 31 is a cross-sectional view of main parts showing the semiconductor device in a manufacturing step continued from FIG. 30.

Next, as shown in FIG. 31, a low-resistance metal silicide layer 71 is formed on the surface of the gate electrode 65 and the n⁺-type semiconductor regions 68 by Salicide (Self Aligned Silicide) technology. To form the metal silicide layer 71, for example, the surfaces of the gate electrode 65 and the n⁺-type semiconductor region 68 is exposed, and a metal film is deposited thereon, and then thermal treatment is performed, thereby forming the metal silicide layer 71 on each surface of the gate electrode 65 and the n⁺-type semiconductor regions 68, followed by removing a non-reacted portion of the metal film thereafter. By forming the metal silicide layer 71, diffusion resistance and contact resistance can be lowered. Also, when the gate electrode 65 is a metal gate electrode, the metal silicide layer 71 is formed on the surfaces of the n⁺-type semiconductor regions 68. And, if unnecessary, the formation of the metal silicide layer 71 can be omitted.

Next, an insulating film 72 is formed on the main surface of the semiconductor substrate 61 so as to cover the gate electrode 65. The insulating film 72 is formed of a single film of a silicon oxide film, or a multilayered film of a silicon nitride film and a silicon oxide film thicker than the silicon nitride film, for example.

Figure 32:
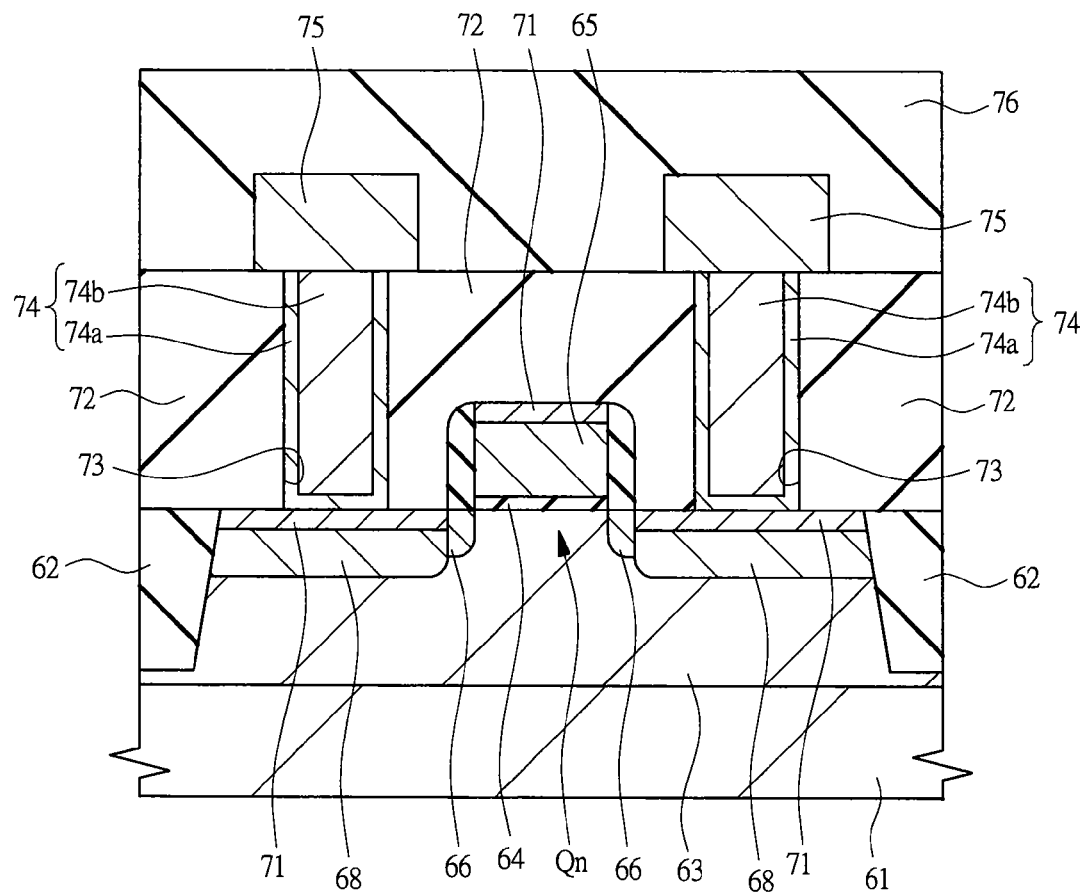
FIG. 32 is a cross-sectional view of main parts showing the semiconductor device in a manufacturing step continued from FIG. 31.

Next, as shown in FIG. 32, by using a photoresist pattern (not shown) formed on the insulating film 72 as an etching mask, the insulating film 72 is subjected to dry etching, thereby forming contact holes (through holes, holes) 73 in the insulating film 72. At the bottom of the contact holes 73, part of the main surface of the semiconductor substrate 61 such as part of the metal silicide layer 71 on the surface of the n⁺-type semiconductor region 68 and part of the metal silicide layer 71 on the surface of the gate electrode 65 are exposed.

Next, a plug 74 made of, for example, tungsten (W), is formed in each contact hole 73. To form the plug 74, for example, a barrier conductive film 74a (for example, a titanium nitride film, or a multilayered film of a titanium film and a titanium nitride film) is formed on the insulating film 72 including inner portions (a bottom portion and side walls) of the contact hole 73. Then, a main conductive film 74b formed of, for example, a tungsten film, is formed on the barrier conductive film 74a through CVD so as to bury the contact hole 73. Then, an unnecessary portion of the main conductive film 74b and the barrier conductive film 74a on the insulating film 72 is removed through CMP or etchback, thereby forming the plug 74.

Next, a wiring 75 made of, for example, tungsten, is formed as a first-layer wiring on the insulating film 72 in which the plug 74 is buried. The wiring 75 can be formed by forming a conductive film such as a tungsten film on the insulating film 72 and patterning this conductive film through photolithography and dry etching. The wiring 75 is electrically connected via the plug 74 to the n⁺-type semiconductor region 68 for the source or drain of the n-channel type MISFET Qn and also to the gate electrode 65. The wiring 75 is not restricted to tungsten, and can be variously modified. For example, the wiring may be formed of a single film made of aluminum (Al) or an aluminum alloy, or a multilayered metal film in which a metal film made of, for example, titanium (Ti) or titanium nitride (TiN), is formed on at least one of upper and lower layers of the above-described single film. Also, the wiring 75 can be an embedded wiring (for example, embedded copper wiring) formed through a damascene method.

Next, an insulating film 76 is formed on the insulating film 72 so as to cover the wiring 75. Then, as with the contact hole 73, a via or a through hole for exposing part of the wiring 75 is formed in the insulating film 76. As with the plug 74 and the wiring 75, a plug for burying the through hole and a second-layer wiring electrically connected to the wiring 75 via the plug are formed, which are not shown and described herein. The second-layer wiring and thereafter can be made as embedded wirings (for example, embedded copper wiring) formed through a damascene method.

Furthermore, as another embodiment, the gate electrode 65 is formed of a polycrystalline silicon film in advance. After the insulating film 72 is formed, the insulating film 72 is subjected to CMP or the like to expose the upper surface of the gate electrode 65. Then, a metal film is formed on the insulating film 72 including the upper surface of the gate electrode 65. By reacting this metal film with the gate electrode 65, the gate electrode 65 can be made as a metal gate electrode made of metal silicide. In this case, after a non-reacted portion of the metal film is removed, and an insulating film is formed on the insulating film 72 including the upper surface of the gate electrode 65, and then the contact hole 73, the plug 74, the wiring 75, and the insulating film 76 are formed. Then, a further upper wiring layer, an insulating film, and others are formed. Finally, a thermal treatment (FGA: Forming Gas Annealing) at on the order of 400° C. is performed under a hydrogen environment, thereby completing a semiconductor device comprising an n-channel type MISFET.

Note that, although the case of forming an n-channel type MISFET has been described, a p-channel type MISFET can be formed by, for example, reversing the conduction type. Also, an n-channel type MISFET and a p-channel type MISFET can be both formed to form a CMISFET (Complementary Metal Insulator Semiconductor Field Effect Transistor).

Although the case of forming the metal oxide film 64 for a gate insulating film as the metal oxide film 2 has been described, it is not limited to this. The method of depositing the metal oxide film 2 in the present embodiment can be also applied to the case of forming the metal oxide film 2 on the main surface of the semiconductor wafer 1W as any film other than a film for a gate insulating film. Since an ALD method is used in the method of depositing the metal oxide film 2 in the present embodiment, the method is suitable when the metal oxide film 2 has a thin film thickness. Therefore, it is effective to apply the depositing method in the present embodiment to the case of forming the metal oxide film 64 for a gate insulating film as the metal oxide film 2. And, since the MISFET characteristics are fluctuated as the film thickness of the gate insulating film is fluctuated, it is important to equalize the film-thickness distribution on the semiconductor wafer. Also from this point of view, it is effective to apply the depositing method in the present embodiment when the metal oxide film 64 for a gat insulating film is formed as the metal oxide film 2.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effectively applied to a method of manufacturing a semiconductor device having a step of forming a metal oxide film on a semiconductor wafer.

What is claimed is:

1. A method of manufacturing a semiconductor device comprising the steps of:
   (a) introducing an inert gas into a chamber where a semiconductor wafer is placed therein so that the chamber has a first pressure of 133 Pa or higher, and lower than 101325 Pa;
   (b) introducing a source gas into the chamber at the first pressure and without exhaust;
   (c) exhausting the source gas in the chamber to outside of the chamber; and
   (d) introducing an oxidation gas into the chamber after the step (c) so as to make the oxidation gas react with molecules of the source gas absorbed on the semiconductor wafer, thereby forming a metal oxide film on the semiconductor wafer.

2. The method of manufacturing a semiconductor device according to claim 1,
   wherein, the absorbed molecules of the source gas are remained on the semiconductor wafer in the step (c).

3. The method of manufacturing a semiconductor device according to claim 1,
   wherein the step (a) includes the steps of:
   (a1) exhausting a gas in the chamber having the semiconductor wafer placed therein to the outside of the chamber; and
   (a2) introducing an inert gas into the chamber without exhaust so that the chamber has the first pressure after the step (a1).

4. The method of manufacturing a semiconductor device according to claim 1,
   wherein the first pressure is equal to or higher than 667 Pa.

5. The method of manufacturing a semiconductor device according to claim 1,
   wherein the first pressure is equal to or lower than 2666 Pa.

6. The method of manufacturing a semiconductor device according to claim 1,
   wherein the steps (a), (b), (c), and (d) are repeated, thereby forming the metal oxide film having a desired thickness on the semiconductor wafer.

7. The method of manufacturing a semiconductor device according to claim 1,
   wherein, after one or more cycles of the steps (a), (b), (c), and (d) are performed,
   a step (e) of performing a thermal treatment on the semiconductor wafer is performed, and then
   one or more cycles of the steps (a), (b), (c), and (d) are performed.

8. The method of manufacturing a semiconductor device according to claim 7,
   wherein the thermal treatment in the step (e) is a spike annealing process.

9. The method of manufacturing a semiconductor device according to claim 7,
   wherein the thermal treatment in the step (e) is performed at a thermal treatment temperature of 700° C. to 900° C.

10. The method of manufacturing a semiconductor device according to claim 1, further comprising the step of,
    after the step (b) and before the step (c),
    (c1) maintaining a state where gas introduction and exhaust are not performed to the chamber and the source gas is present in the chamber.

11. The method of manufacturing a semiconductor device according to claim 10,
    wherein the step (c1) is performed for one to ten seconds.

12. The method of manufacturing a semiconductor device according to claim 1,
    wherein, in the step (b), the source gas and an inert gas are introduced into the chamber.

13. The method of manufacturing a semiconductor device according to claim 12,
    wherein a film-deposition apparatus including the chamber comprises:
    a first gas path connected to the chamber;
    a second gas path for feeding a first gas formed of a mixed gas of the source gas and an inert gas to the first gas path; and
    a third gas path for feeding a second gas formed of an inert gas without containing the source gas to the first gas path,
    wherein the step (b) includes the steps of:
    (b1) introducing the first gas into the chamber via the second gas path and the first gas path with interrupting an inflow of the second gas from the third gas path to the first gas path, and permitting an inflow of the first gas from the second gas path to the first gas path; and
    (b2) introducing the second gas into the chamber via the third gas path and the first gas path after the step (b1), with interrupting an inflow of the first gas from the second gas path to the first gas path, and permitting an inflow of the second gas from the third gas path to the first gas path, and
    wherein the first gas which has been introduced into the first gas path in the step (b1) is introduced into the chamber together with the second gas in the step (b2).

14. The method of manufacturing a semiconductor device according to claim 13,
    wherein, in the film-deposition apparatus,
    a flow rate of the second gas transferred from the third gas path to the first gas path in the step (b2) is larger than a flow rate of the first gas transferred from the second gas path to the first gas path in the step (b1).

15. The method of manufacturing a semiconductor device according to claim 1,
    wherein the metal oxide film is a rare-earth oxide film.

16. The method of manufacturing a semiconductor device according to claim 15,
    wherein the source gas is represented by a chemical formula of $Ln(RCp)_3$, where Ln represents a rare-earth element, R represents an alkyl group and Cp represents a cyclopentadienyl group.

17. The method of manufacturing a semiconductor device according to claim 16,
    wherein the oxidation gas is $H_2O$ gas.

18. The method of manufacturing a semiconductor device according to claim 1,
    wherein the metal oxide film is a lanthanum oxide film.

19. The method of manufacturing a semiconductor device according to claim 18, wherein the source gas is represented by a chemical formula of $La(RCp)_3$, where R represents an alkyl group and Cp represents a cyclopentadienyl group.

20. The method of manufacturing a semiconductor device according to claim 19, wherein the source gas is represented by a chemical formula of $La(i\text{-}C_3H_7C_5H_4)_3$.

* * * * *